(12) United States Patent
Hsu et al.

(10) Patent No.: US 11,916,151 B2
(45) Date of Patent: Feb. 27, 2024

(54) SEMICONDUCTOR STRUCTURE HAVING FIN WITH ALL AROUND GATE

(71) Applicant: TAIWAN SEMICONDUCTOR MANUFACTURING COMPANY LTD., Hsinchu (TW)

(72) Inventors: Chia-Ming Hsu, Hualien County (TW); Yi-Jing Li, Hsinchu (TW); Chih-Hsin Ko, Kaohsiung County (TW); Kuang-Hsin Chen, Jung-Li (TW); Da-Wen Lin, Hsinchu (TW); Clement Hsingjen Wann, Carmel, NY (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 336 days.

(21) Appl. No.: 17/357,997

(22) Filed: Jun. 25, 2021

(65) Prior Publication Data

US 2022/0416090 A1 Dec. 29, 2022

(51) Int. Cl.
*H01L 29/423* (2006.01)
*H01L 29/786* (2006.01)
*H01L 29/06* (2006.01)
*H01L 29/66* (2006.01)
*H01L 21/02* (2006.01)

(52) U.S. Cl.
CPC .... *H01L 29/78696* (2013.01); *H01L 21/0259* (2013.01); *H01L 21/02532* (2013.01); *H01L 29/0665* (2013.01); *H01L 29/42392* (2013.01); *H01L 29/66545* (2013.01); *H01L 29/66742* (2013.01)

(58) Field of Classification Search
CPC .......... H01L 21/02532; H01L 21/0259; H01L 29/42392; H01L 29/66545; H01L 29/66742; H01L 29/78696
USPC ......................................................... 257/328
See application file for complete search history.

(56) References Cited

U.S. PATENT DOCUMENTS

| | | |
|---|---|---|
| 8,174,073 B2 * | 5/2012 | Lee .................. H01L 21/823431 |
| | | 257/288 |
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,209,247 B2 | 12/2015 | Colinge et al. |
| 9,214,555 B2 | 12/2015 | Oxland et al. |
| 9,236,267 B2 | 1/2016 | De et al. |

(Continued)

*Primary Examiner* — Hoai V Pham
(74) *Attorney, Agent, or Firm* — WPAT LAW; Anthony King

(57) ABSTRACT

Present disclosure provides a semiconductor structure, including a semiconductor fin having a first portion and a second portion over the first portion, a first conductive region abutting a first lateral surface of the first portion and a first lateral surface of the second portion, a metal gate having a bottom portion and an upper portion, the bottom portion being between the first portion and the second portion of the semiconductor fin, and the upper portion being over the second portion of the semiconductor fin, and a first spacer between the bottom portion of the metal gate and the first conductive region. A method for manufacturing the semiconductor structure described herein is also provided.

20 Claims, 27 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,548,303 B2 | 1/2017 | Lee et al. |
| 9,576,814 B2 | 2/2017 | Wu et al. |
| 9,608,116 B2 | 3/2017 | Ching et al. |
| 10,269,901 B2 | 4/2019 | Ching et al. |
| 10,312,327 B2 | 6/2019 | Chang et al. |
| 2017/0194213 A1 | 7/2017 | Ching et al. |

\* cited by examiner

US 11,916,151 B2

SEMICONDUCTOR STRUCTURE HAVING FIN WITH ALL AROUND GATE

BACKGROUND

Integrated circuit typically includes a large number of components, particularly transistors. When the dimension of the transistor continuously shrinks, the effect of channel control (gate control) of the transistor becomes more significant. Alternatively stated, the configuration of the gate and the channel becomes critical. Thus, non-planar transistors (such as fin filed-effect transistor and gate-all-around transistor) are used to manipulate the channel control ability.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION OF THE DISCLOSURE

Figure 1A:
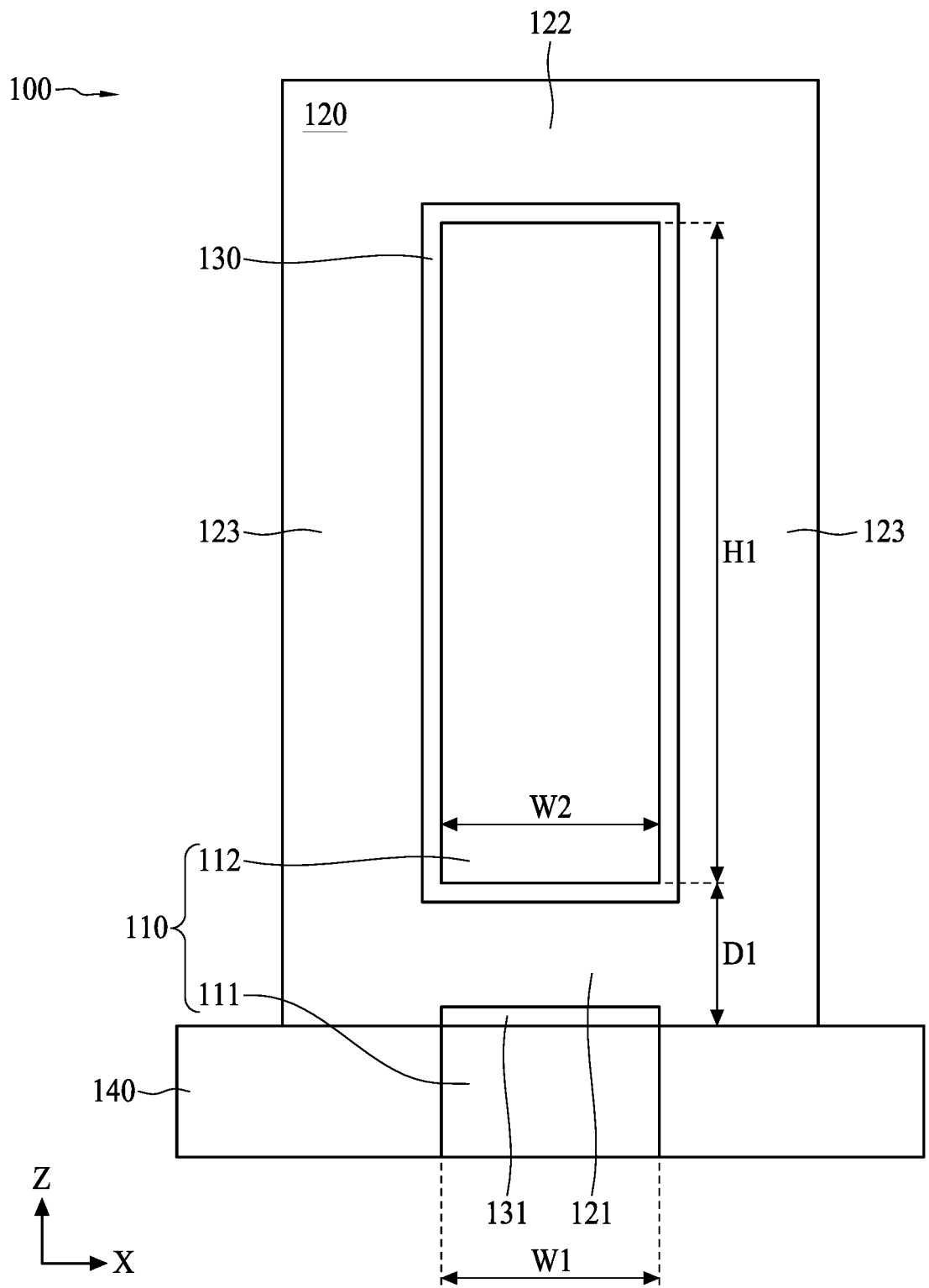
FIG. 1A and FIG. 1B are cross sectional views showing a semiconductor structure, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
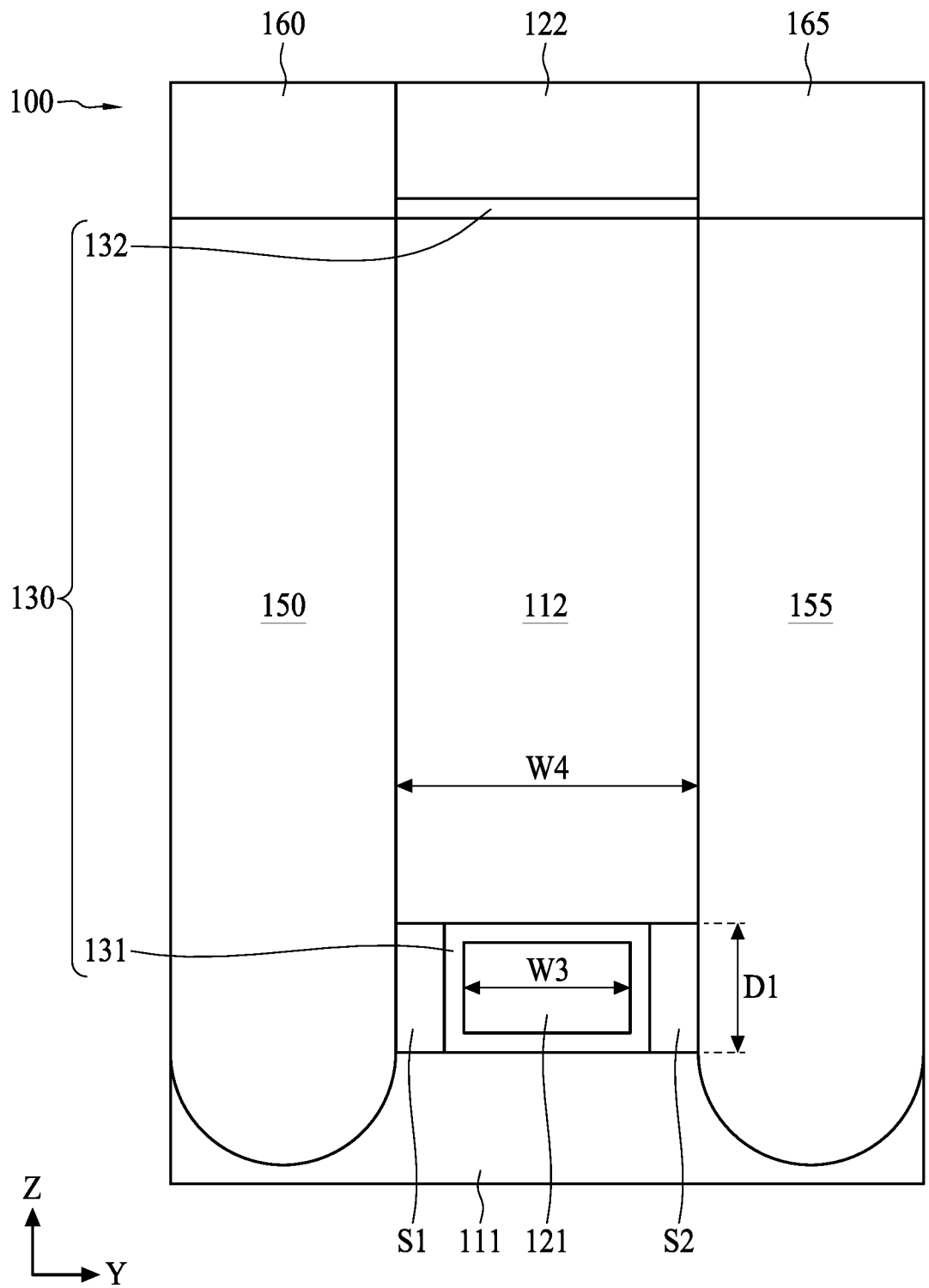

Referring to FIG. 1A and FIG. 1B, FIG. 1A and FIG. 1B are cross sectional views 100A and 100B showing a semiconductor structure 100, respectively, in accordance with some embodiments of the present disclosure. In some embodiments, the semiconductor structure 100 can be a fin field-effect transistor (FinFET). The cross section view 100A shows an X-Z plane of the semiconductor structure 100. The cross section view 100B shows a Y-Z plane of the semiconductor structure 100. When the semiconductor structure 100 is a FinFET, a channel of the FinFET is along a Y-direction shown in FIG. 1A and FIG. 1B.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As illustrated in FIG. 1A, the semiconductor structure 100 includes a semiconductor fin 110, a metal gate 120, a dielectric region 130 and an insulator 140. The semiconductor fin 110 extends from a substrate (not shown), and has a fin portion 111 and a fin portion 112 over the fin portion 111. The fin portion 111 is disposed in the isolation feature 140, for example, a shallow trench isolation (STI), and being substantially coplanar with the isolation feature 140 in the cross section view 100A. The fin portion 112 is surrounded by the dielectric region 130. The fin portion 112 is further surrounded by the metal gate 120 with the dielectric region 130 therebetween. A bottom portion 130 of the dielectric region 130 is over the fin portion 111. Therefore, in the cross section view 100A, the fin portion 111 and the fin portion 112 are separated by the metal gate 120 and the dielectric region 130.

The fin portion 112 is in contact with the dielectric region 130. In some embodiments, the dielectric region 130 may include high-k dielectric materials or other suitable material. For example, the high-k dielectric material has a dielectric constant greater than that of thermal silicon oxide (~3.9), such as $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON) or the combinations thereof. The dielectric region 130 is surrounded by and in contact with the metal gate 120. The metal gate 120 includes a bottom portion 121, an upper portion 122 and a lateral portion 123. In the cross section view 100A, the bottom portion 121 is between the fin portion 111 and the fin portion 112, the upper portion 122 is over the fin portion 122, and the lateral portion 123 connects the bottom portion 121 and the upper portion 122. In some embodiments, the metal gate 120 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof.

In some embodiments, the metal gate 120 and the dielectric region 130 are referred to as a gate structure. Because of the metal gate 120 and the dielectric region 130 surrounds the fin portion 112, the semiconductor structure 100 is implemented as a gate-all-around (GAA) FinFET. In some embodiments, as shown in FIG. 1A, four sides of the fin portion 112 in contact with the dielectric region 130 can be the channel of the GAA FinFET, and the carries of the GAA FinFET travel through the channel along the Y-direction, as shown in FIG. 1B.

The GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In FIG. 1A, the fin portion 111 has a width W1 along an X-direction, and the fin portion 112 has a width W2 along the X-direction and a height H1 along a Z-direction. In some embodiments, the height H1 is greater than the width W1 and the width W2. In other words, the fin portion 112 has a longer side along the Z-direction and a shorter side along the X-direction.

In some embodiments, the fin portion 111 and the fin portion 112 have a substantial uniformed width along the X-direction. Therefore, the width W1 is substantially the same as the width W2. In other embodiments, each of the fin portion 111 and the fin portion 112 has a substantial uniformed width along the X-direction, but the width W1 is slightly greater than the width W2. In various embodiments, as will be discussed in FIG. 2A and FIG. 2B, the width of the semiconductor fin 110 varies along the Z-direction, in which the fin portion 111 is wider than the fin portion 112 along the X-direction. Therefore, in some embodiments and depending on the processing condition, the width W1 can be greater than the width W2.

A distance D1 indicates a distance between the fin portion 111 and the fin portion 112 in the cross section view 100A. In some embodiments, the distance D1 has a range of from about 10 nm to about 20 nm.

As illustrated in FIG. 1B, the semiconductor structure 100 includes the fin portion 111, the fin portion 112, the bottom portion 121, the upper portion 122, the dielectric region 130, a spacer S1, a spacer S2, a conductive region 150, and a conductive region 155. The conductive region 150 and the conductive region 155 abut opposite lateral surfaces of the fin portion 112. In some embodiments, the conductive region 150 and the conductive region 155 further surrounds a portion of the fin portion 111. The dielectric region 130 includes the bottom portion 131 and an upper portion 132, in which the bottom portion 131 corresponds to the portion of the dielectric region 130 in contact with the bottom portion 121 of the metal gate 120, as shown in FIG. 1A, and the upper portion 132 correspond to the portion of the dielectric region 130 in contact with the upper portion 122 of the metal gate 120, as shown in FIG. 1A.

The spacer S1 and the spacer S2 are able to be observed in the cross section view 100B. The spacer S1 and the spacer S2 are adjacently disposed along the Y-direction and between the fin portion 111 and the fin portion 112 along the Z-direction. The spacer S1 is in contact with the fin portion 111, the bottom portion 131 of the dielectric region 130, the fin portion 112 and the conductive region 150. The spacer S2 is in contact with the fin portion 111, the bottom portion 131 of the dielectric region 130, the fin portion 112 and the conductive region 155. Because the spacer S1 and the spacer S2 are in contact with the fin portion 111 and the fin portion 112, at least part of the fin portion 112 is not covered by the dielectric region 130 in the cross section view 100B. As shown in FIG. 1B, the bottom portion 121 of the metal gate 120 and the bottom portion 131 of the dielectric region 130 are shorter than the fin portion 112 along the Y-direction. Alternatively stated, a width W3 of the bottom portion 121 of the metal gate 120 is less than a width W4 of the fin portion 112 along the Y-direction. The distance D1 also indicates a height of the spacer S1 and the spacer S2 along the Z-direction. In some embodiments, the spacers S1 and S2 have a width about 4 nm along the Y-direction.

In some embodiments, the spacer S1 and the spacer S2 are configured to protect the conductive region 150 and the conductive region 155 from etchants during a replacement gate etching operation. In some embodiments, the spacer S1 and the spacer S2 are configured to isolate the bottom portion 121 of the metal gate 120 from the conductive region 150 and the conductive region 155. The spacer S1 and the spacer S2 may include a dielectric material such as silicon oxide, silicon nitride, silicon carbide, silicon oxynitride, SiCN films, silicon oxycarbide, SiOCN films, and/or combinations thereof.

In some embodiments, the conductive region 150 and the conductive region 155 are source/drain regions of the GAA FinFET, and the source/drain regions sandwiches the fin portion 112 to form a channel in the fin portion 112 along the Y-direction. The conductive region 150 and the conductive region 155 have a convex contour contacting the fin portion 111. In some embodiments, the conductive region 150 and the conductive region 155 are epitaxially grown.

The semiconductor structure 100 further includes a contact feature 160 and a contact future 165 over the conductive regions 150 and 155, respectively. When the semiconductor structure 100 is a GAA FinFET, the contact feature 160 and the contact feature 165 are configured to extract carriers from the source/drain regions (i.e., the conductive regions 160 and 165), and the semiconductor structure 100 may further include spacers configured to isolate the contact features 160 and 165 from the upper portion 122 of the metal gate 120.

Figure 2A:
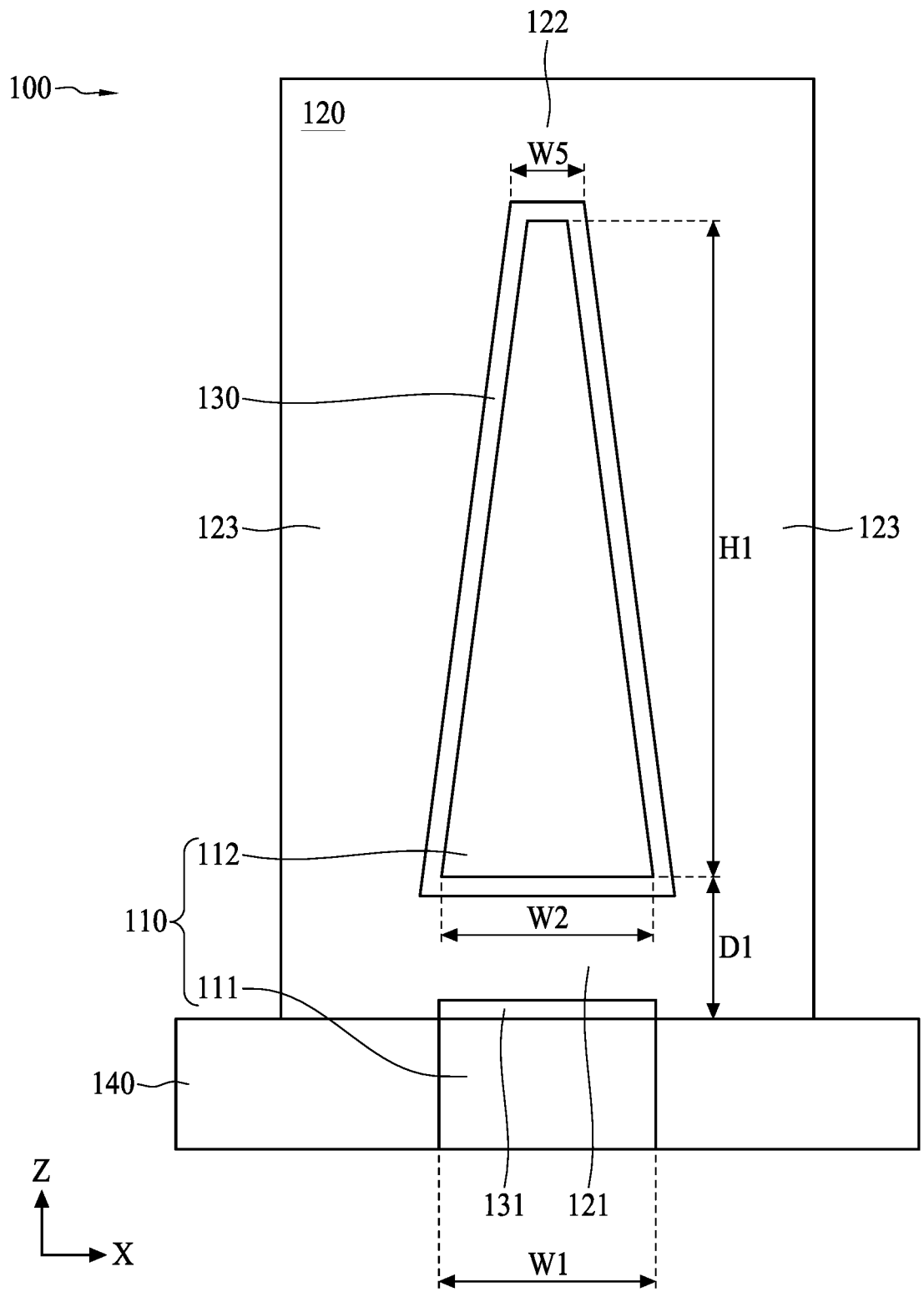
FIG. 2A and FIG. 2B are cross sectional views showing a semiconductor structure, in accordance with other embodiments of the present disclosure.
Figure 2B:
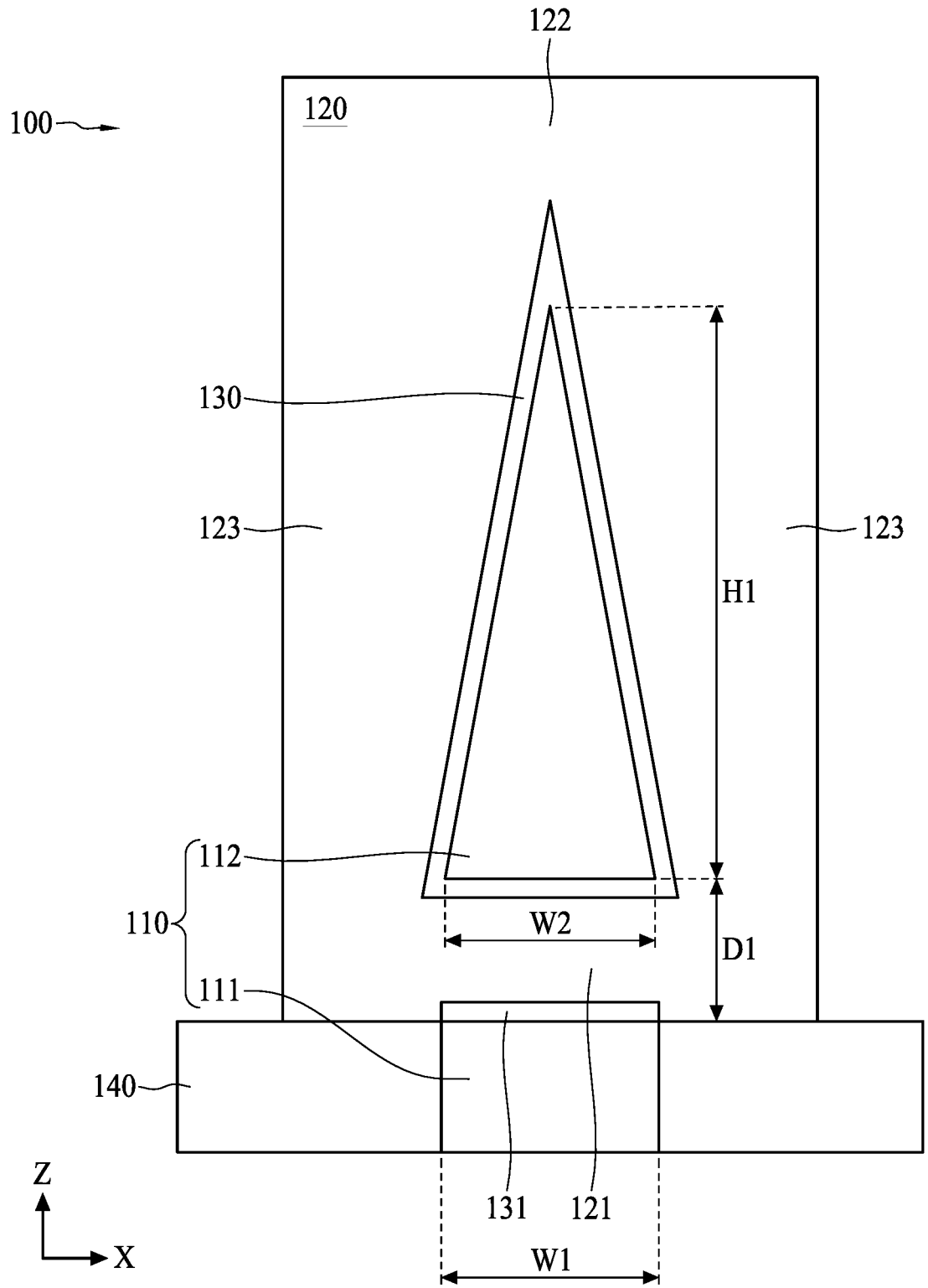

The fin portion 112 shown in the cross section view 100A has a rectangle contour. However, in other embodiments, the shape of the fin portion 112 viewed in the X-Z plane may be different. Referring to FIG. 2A and FIG. 2B, FIGS. 2A and 2B are cross sectional views 200A and 200B showing the X-Z plane of the semiconductor structure 100, respectively, in accordance with other embodiments of the present disclosure. To facilitate understanding, the numerals of the similar elements in FIG. 2A and FIG. 2B are designated as the same numerals in FIG. 1A.

In FIG. 2A and FIG. 2B, the semiconductor 100 includes the fin portion 111 and the fin portion 112 of the semiconductor fin 110, the metal gate 120, the dielectric region 130, and the isolator 140. The metal gate 120, the dielectric region 130, and the isolator 140 are similar to those shown in FIG. 1A. Thus, the descriptions of the metal gate 120, the dielectric region 130, and the isolator 140 in FIG. 2A and FIG. 2B are not repeated herein.

In the cross section views 200A and 200B, the width of the fin portion 112 varies along the Z-direction. The fin portion 112 has the width W2 and a width W5 along the X-direction on two opposite surfaces. The width W5 is less than the width W2. The width of the fin portion 112 is shrunk from the width W2 to the width W5 along the Z-direction, so as to make the fin portion 112 is a trapezoid in the cross section view 200A. Therefore, the fin portion 112 has a trapezoidal contour. The dielectric region 130 surrounds the fin portion 112 along the trapezoidal contour. The dielectric region 130 has a substantially uniformed thickness, and the metal gate 120 surrounds the dielectric region 130 along a trapezoidal contour of the dielectric region 130.

In the cross section view 200B, the fin portion 112 is a triangle. Therefore, the fin portion 112 has a triangular contour. The dielectric region 130 surrounds the fin portion 112 along the triangular contour. The dielectric region 130 has a substantially uniformed thickness, and the metal gate 120 surrounds the dielectric region 130 along a triangular contour of the dielectric region 130.

In the cross section views 200A and 200B, the width W1 is greater than the width W2, and the height H1 is greater than the width W2. In some embodiments, the height H1 is not greater than about 68 nm. For example, the width W2 is about 6 nm, and the height H1 is about 50 nm. The values of width W2 and height H1 are provided for illustrated purposes. Various values of the width W2 and height H1 are within the contemplated scope of the present disclosure. For example, in various embodiments, the values of the width W2 and height H1 vary with the technology nodes.

In a GAA FinFET, a DC current in the channel is associated with the cross section area of the channel, and an AC current in the channel is associated with the gate control ability of the GAA FinFET. When the cross section area of the channel is increased, the DC current increases. When the GAA FinFET has a better gate control ability (smaller cross section area of the channel), the AC current increases. When the semiconductor structure 100 is the GAA FinFET, the semiconductor structure 100 with the fin portion 112 in the cross section view 100A can obtain a larger DC current and a smaller AC current than the semiconductor structure 100 with the fin portion 112 in the cross section views 200A and 200B. In contrast, the semiconductor structure 100 with the fin portion in the cross section view 200B can obtain a larger AC current and a smallest DC current than the semiconductor structure 100 with the fin portion 112 in the cross section views 100A and 200A.

Figure 3A:
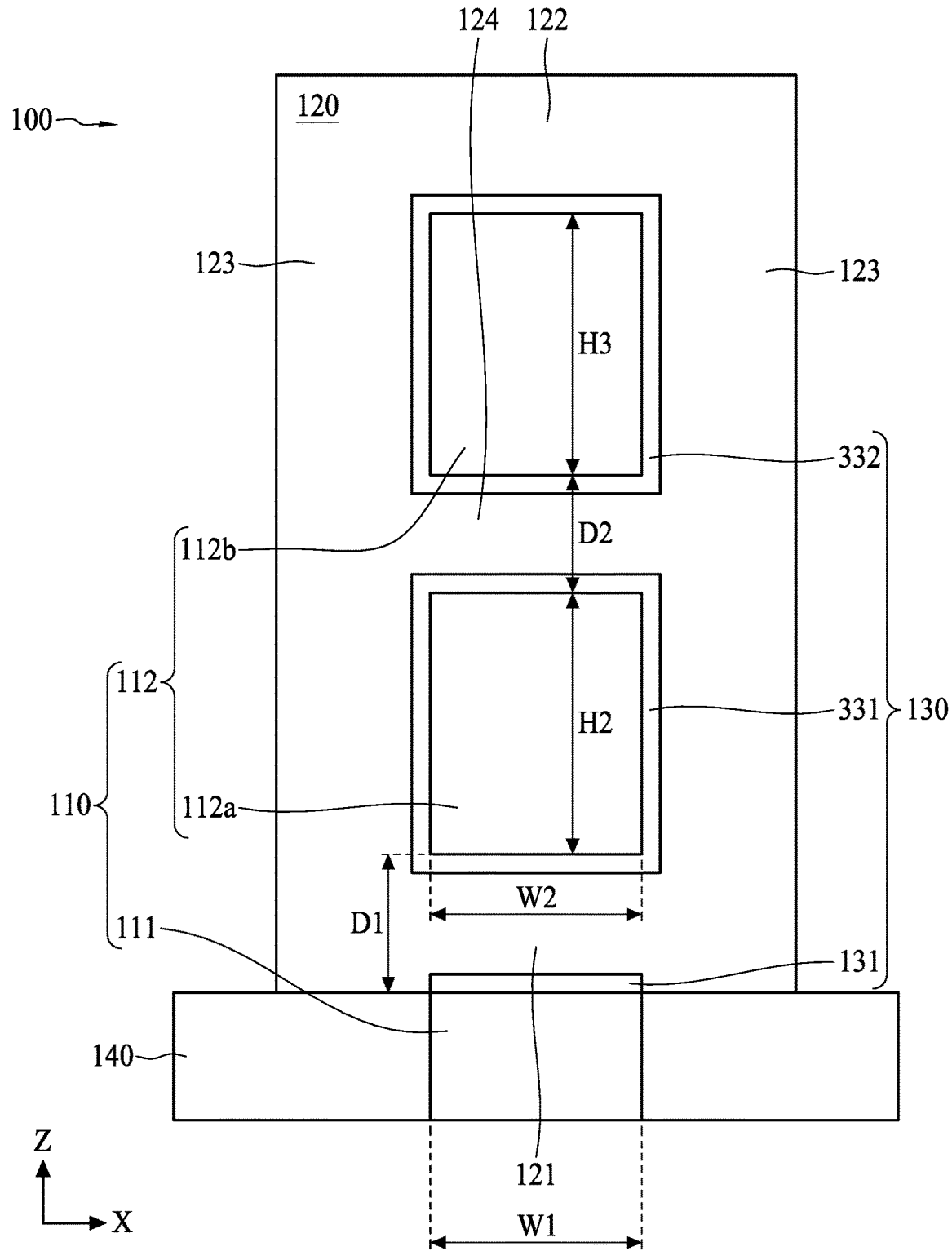
FIG. 3A, FIG. 3B and FIG. 3C are cross sectional views showing a semiconductor structure, in accordance with various embodiments of the present disclosure.
Figure 3B:
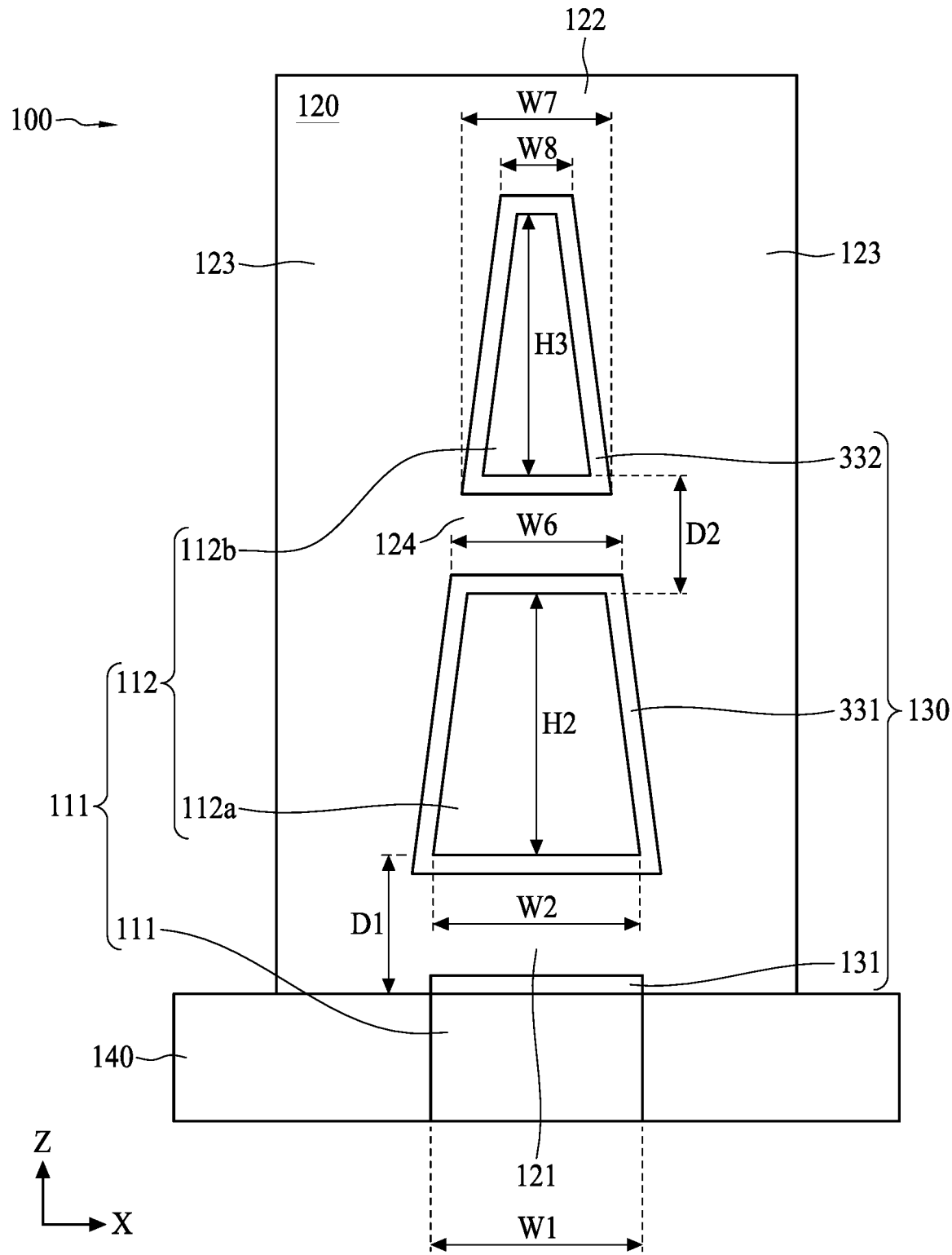
Figure 3C:
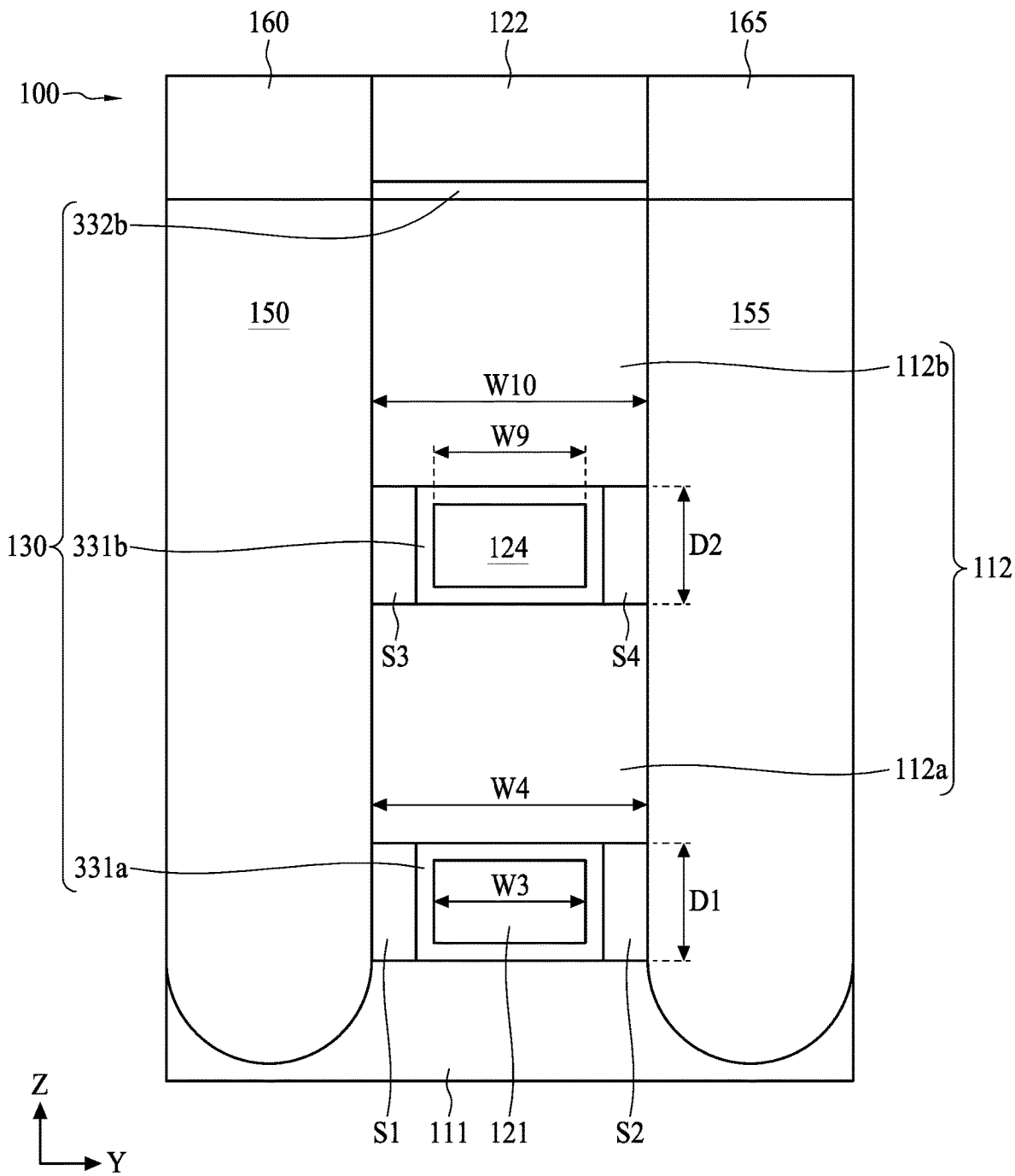

Reference is made to FIG. 3A, FIG. 3B, and FIG. 3C. FIGS. 3A, 3B, and 3C are cross sectional views 300A, 300B, and 300C showing a semiconductor structure 100, respectively, in accordance with various embodiments of the present disclosure. The cross section view 300A and 300B show the X-Z plane of the semiconductor structure 100, and the cross section view 300C shows the Y-Z plane of the semiconductor structure 100. To facilitate understanding, the numerals of the similar elements in FIGS. 3A, 3B, and 3C are designated as the same numerals in FIG. 1A and FIG. 1B.

In FIG. 3A, the fin portion 112 includes a sub-portion 112a and a sub-portion 112b over the sub-portion 112a, the metal gate 120 further includes an intermediate portion 124 connecting the lateral portion 123, and the dielectric region 130 includes a bottom portion 131, a bottom portion 331 and an upper portion 332.

The sub-portion 112a and the sub-portion 112b of the fin portion 112 are surrounded by the bottom portion 331 and the upper portion 332 of the dielectric region 130, respectively, and are separated by the intermediate portion 124 of the metal gate 120. The bottom portion 131 of the dielectric region 130 is over the fin portion 111. As shown in FIG. 3A, the sub-portion 112a and the sub-portion 112b of the fin portion 112 are individually surrounded by the dielectric region 130 and the metal gate 120.

The width W1 indicates the width of the fin portion 111 along the X-direction, and the width W2 indicates the width of the sub-portion 112a and the sub-portion 112b along the X-direction. A height H2 indicates the height of the sub-portion 112a along the Z-direction, and a height H3 indicates the height of the sub-portion 112b along the Z-direction. The width W1 is not less than the width W2, and both of the height H2 and the height H3 are greater than the width W2.

In some embodiments, the sub-portion 112a and the sub-portion 112b are substantially identical. The width W1 is substantially equal to the width W2, or the width W1 is slightly greater than the width W2. In some embodiments, a distance D2 indicates the distance between the sub-portion 112a and the sub-portion 112b is the same as the distance D1. Thus, the distance D2 has a range of about 10 nm to about 20 nm.

In some embodiments, a shape of the sub-portion 112b can be different from a shape of the sub-portion 112a. In the cross section view 300B, the widths of the sub-portions 112a and 112b vary along the Z-direction. The sub-portion 112a has the width W2 and a width W6 on the opposite surfaces, in which the width W6 is less than the width W2. In other words, the width of the sub-portion 112a is shrunk from the width W2 to the width W6. The sub-portion 112b has a width W7 and a width W8 on the opposite surfaces, in which the width W8 is less than the width W7. In other words, the width of the sub-portion 112b is shrunk from the width W7 to the width W8. In some embodiments, the width W7 is less than the width W6.

The semiconductor structure 100 having the cross section view 300A and the semiconductor structure 100 having the cross section view 300B have the same cross section view 300C at the Y-Z plane. Referring to FIG. 3C, the semiconductor structure 100 further includes a spacer S3 and a spacer S4. Similar to the spacers S1 and S2, the spacers S3 and S4 are able to be observe in the cross section view 300C. The spacer S3 and the spacer S4 are adjacently disposed along the Y-direction and between the sub-portion 112a and the sub-portion 112b along the X-direction.

The spacer S1 is in contact with the fin portion 111, a portion 331a of the dielectric region 130, the sub-portion 112a of the fin portion 112, and the conductive region 150. The spacer S2 is in contact with the fin portion 111, the portion 331a of the dielectric region 130, the sub-portion 112a of the fin portion 112, and the conductive region 155.

The spacer S3 is in contact with the sub-portion 112a of the fin portion 112, a portion 331b of the dielectric region 130, the sub-portion 112b of the fin portion 112, and the conductive region 150. The spacer S4 is in contact with the sub-portion 112a of the fin portion 112, the portion 331b of the dielectric region 130, the sub-portion 112b of the fin portion 112, and the conductive region 155.

As discussed in FIG. 1B, the width W4 is greater than the width W3. Based on the same reason, as illustrated in FIG. 3C, a width W10 of the sub-portion 112b of the fin along the Y-direction being greater than a width W9 of the upper portion 124 of the metal gate 120 along the Y-direction. In some embodiments, the width W3 is substantially the same as the width W9, and the width W4 is substantially the same as the width W10. The distance D2 also indicates a height of the spacer S3 the spacer S4 along the Z-direction. In some embodiments, the spacers S3 and S4 have a width about 4 nm along the Y-direction.

In some embodiments, the spacers S1, S2, S3, and S4 are configured to protect the conductive region 150 and the conductive region 155 from etchants during a replacement gate etching operation. In some embodiments, the spacers S1 and S2 are configured to isolate the bottom portion 121 of the metal gate 120 from the conductive region 150 and the conductive region 155, and the spacers S3 and S4 are configured to isolate the intermediate portion 124 of the metal gate 120 from the conductive region 150 and the conductive region 155. The spacers S1, S2, S3, and S4 may include a dielectric material such as silicon oxide, silicon nitride, silicon carbide, silicon oxynitride, SiCN films, silicon oxycarbide, SiOCN films, and/or combinations thereof.

Figure 4:
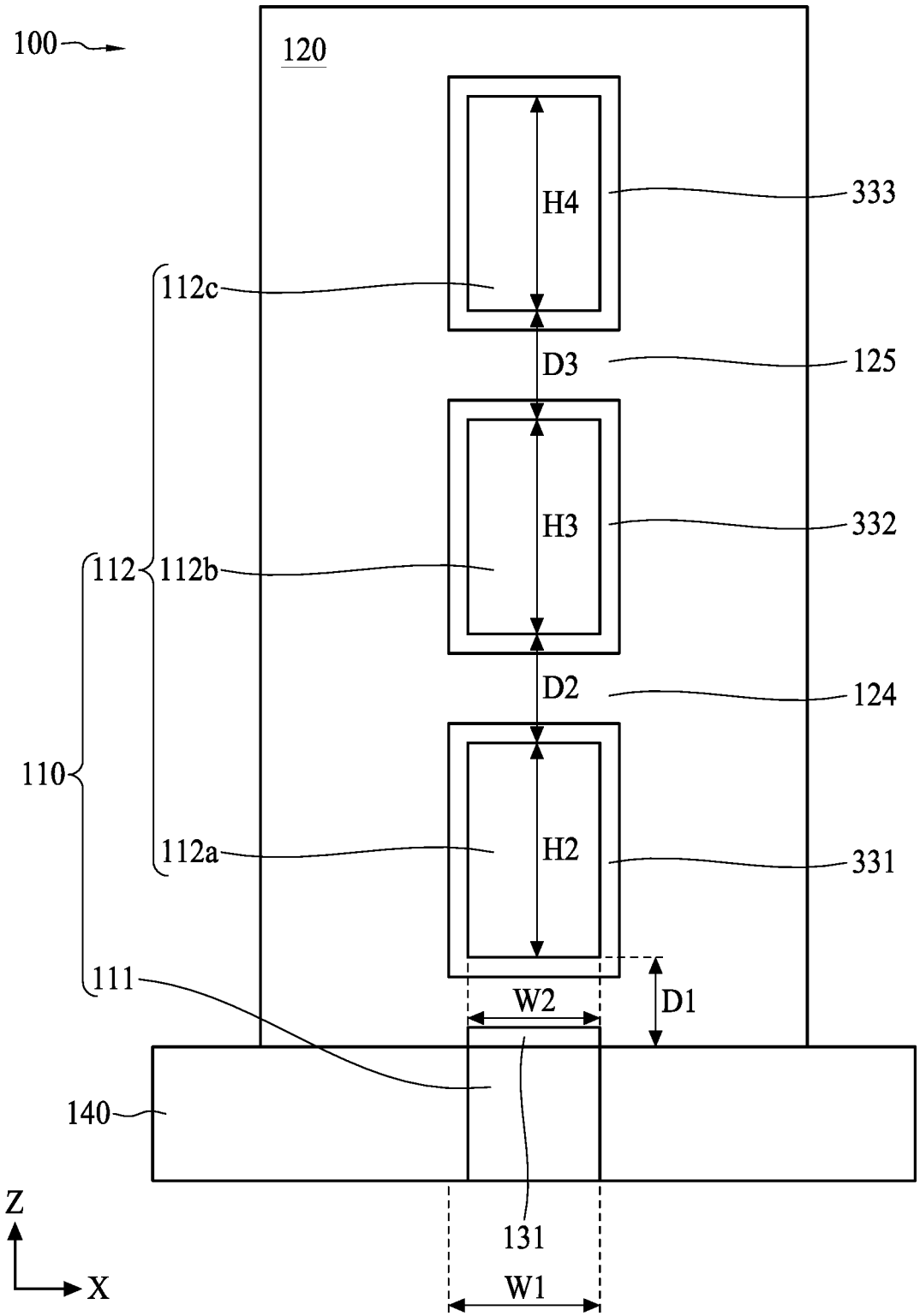
FIG. 4 is cross sectional view showing a semiconductor structure, in accordance with alternative embodiments of the present disclosure.

In alternative embodiments, the fin portion 112 may include more than two sub-portions as illustrated in FIG. 4. Referring to FIG. 4, a cross section view 400A of the semiconductor structure 100 shows that the fin portion 112 including sub-portions 112a, 112b, and 112c. The sub-portion 112b is over the sub-portion 112a, and the sub-portion 112c is over the sub-portion 112b. The dielectric region 130 further includes a top portion 333 surrounding the sub-portion 112c. The metal gate 120 further includes an intermediate portion 125 disposed between the sub-portion 112b and the sub-portion 112c. To facilitate understanding, the numerals of similar elements in FIG. 4 are designated with the same numerals in FIG. 1A and FIG. 3A.

In the cross section view 400A, the sub-portions 112a, 112b, and 112c of the fin portion 112 are individually surrounded by the dielectric region 130 and the metal gate 120. The distance D1 indicates the distance between the fin portion 111 and the sub-portion 112a along the Z-direction, the distance D2 indicates the distance between the sub-portion 112a and the sub-portion 112b along the Z-direction, and a distance D3 indicates the distance between the sub-portion 112b and the sub-portion 112c along the Z-direction.

The heights H2, H3, and H4 indicate the height of the sub-portions 112a, 112b, and 112c, respectively, along the Z-direction. In some embodiments, the distances D1, D2, and D3 are substantially the same, and have a range of about 10 nm to about 20 nm. In some embodiments, sub-portions 112a, 112b, and 112c are substantially identical. Thus, the heights H1, H2, and H3 are substantially the same. In some embodiments, the heights H1, H2, and H3 is not greater than about 16 nm.

Figure 5:
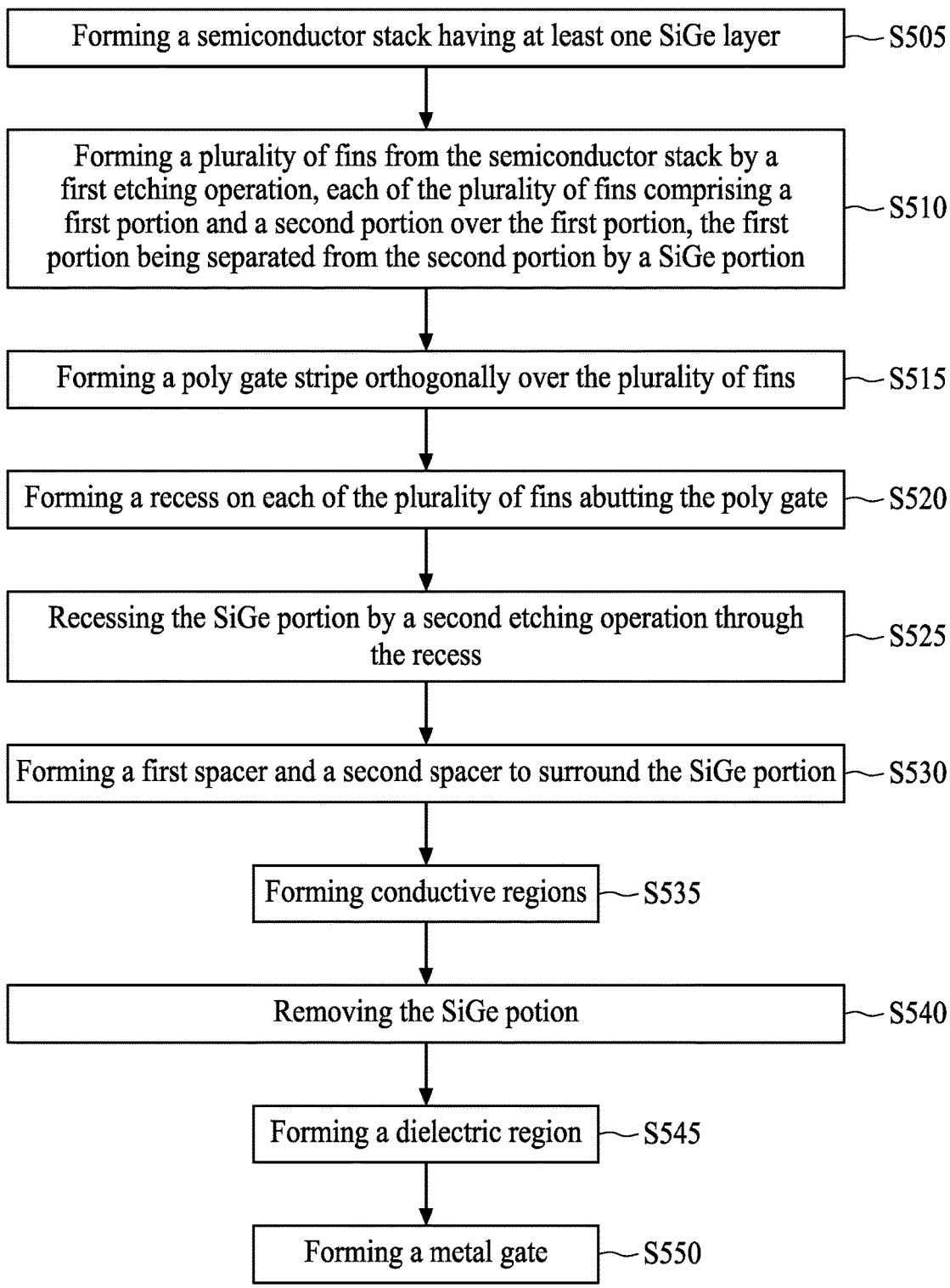
FIG. 5 is a flow chart of a method for manufacturing a semiconductor structure, in accordance with some embodiments of the present disclosure.

Reference is made to FIG. 5. FIG. 5 is a flow chart of a method 500 for manufacturing a semiconductor structure 100 described herein, in accordance with some embodiments of the present disclosure. FIG. 6A to FIG. 10E are cross sectional views of a semiconductor structure 100 at various manufacturing operations, in accordance with some embodiments of the present disclosure. The method 500 will be describes with reference to FIG. 6A to FIG. 10E below.

The method 500 is performed to fabricate the semiconductor structure 100 as shown in FIG. 1A to FIG. 4. The method 500 includes operations S505, S510, S515, S520, S525, S530, S535, S540, S545, and S550.

Figure 6A:
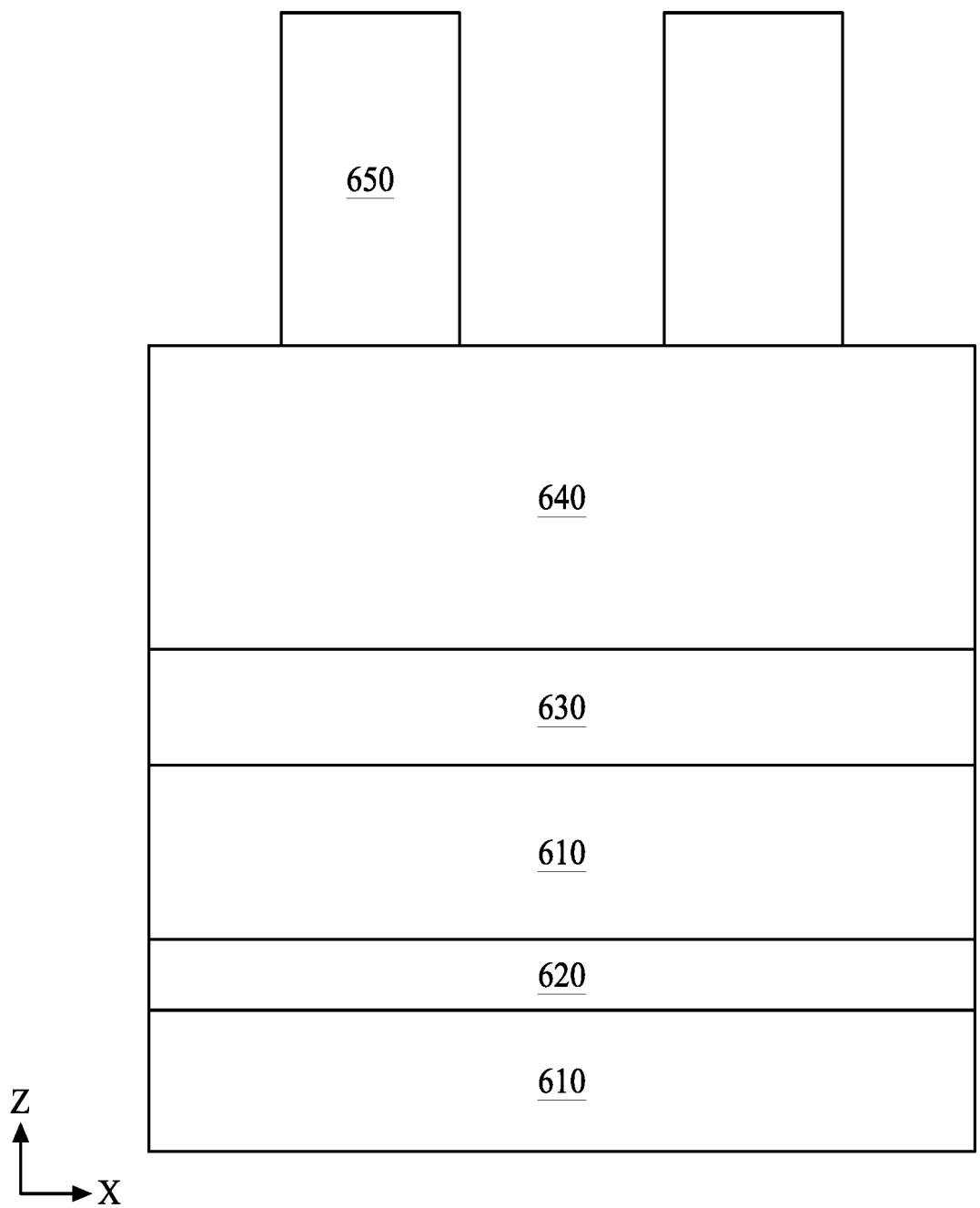
FIG. 6A, FIG. 6B, FIG. 6C and FIG. 6D are cross sectional views of a semiconductor structure at various manufacturing operations, in accordance with some embodiments of the present disclosure.

Referring to FIG. 6A and operation S505, a semiconductor stack 600 having at least one SiGe layer 620 is formed. In some embodiments, the semiconductor stack 600 can include one or more epitaxial layers, for example, epitaxial layer 610, stacked with the SiGe layer 620 in an alternative fashion. In some embodiments, the at least one SiGe layer 620 has a thickness ranging from about 10 nm to about 20 nm, and each epitaxial layer 610 may have a thickness similar to the thickness of the SiGe layer 620 or no greater than about 70 nm. It should be noted that one SiGe layer illustrated in FIG. 6A is for illustrative purposes only and not intended to be limiting. It can be appreciated that more than one of SiGe layers 620 can be formed in the semiconductor stack 600. For example, depending on the final structure design, the number of the SiGe layer 620 can be two or three.

The semiconductor stack 600 may further include a nitride layer 630, an oxide layer 640 over the nitride layer 630, and an amorphous Si (a-Si) layer 650 over the oxide layer 640. The nitride layer 630 and the oxide layer 640 are configured as a hard mask layer to protect portions of the epitaxial layer 610 and the at least one SiGe layer 620 and/or to define a pattern (such as a fin of the GAA FinFET). In some embodiments, the nitride layer 630 includes SiN, and the oxide layer 640 includes $SiO_2$. The nitride layer 630 may be formed by chemical vapor deposition (CVD) deposition or other suitable technique. The oxide layer 640 may be formed by CVD, thermal grown technique, atomic layer deposition (ALD), or other suitable technique.

Figure 6B:
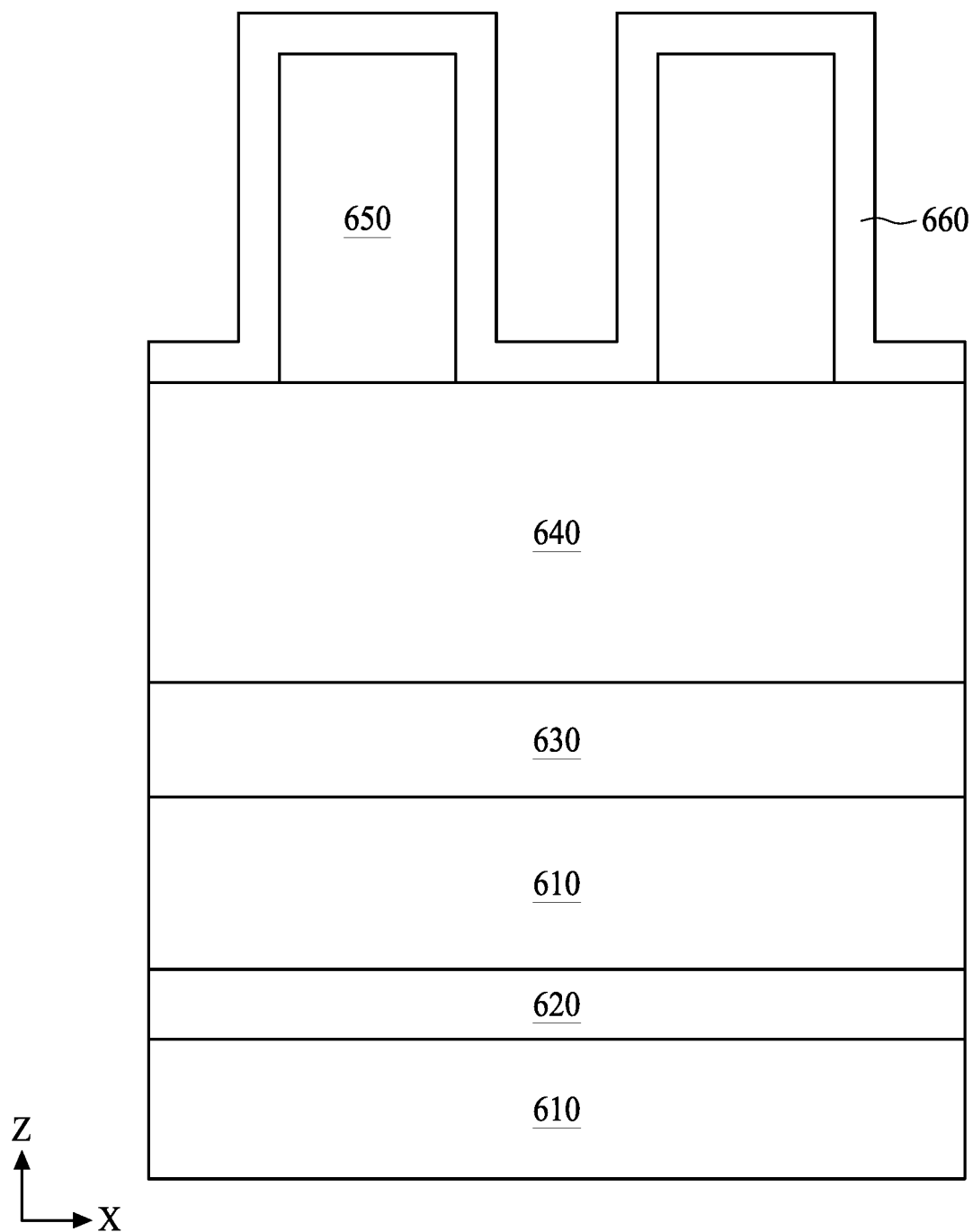
Figure 6C:
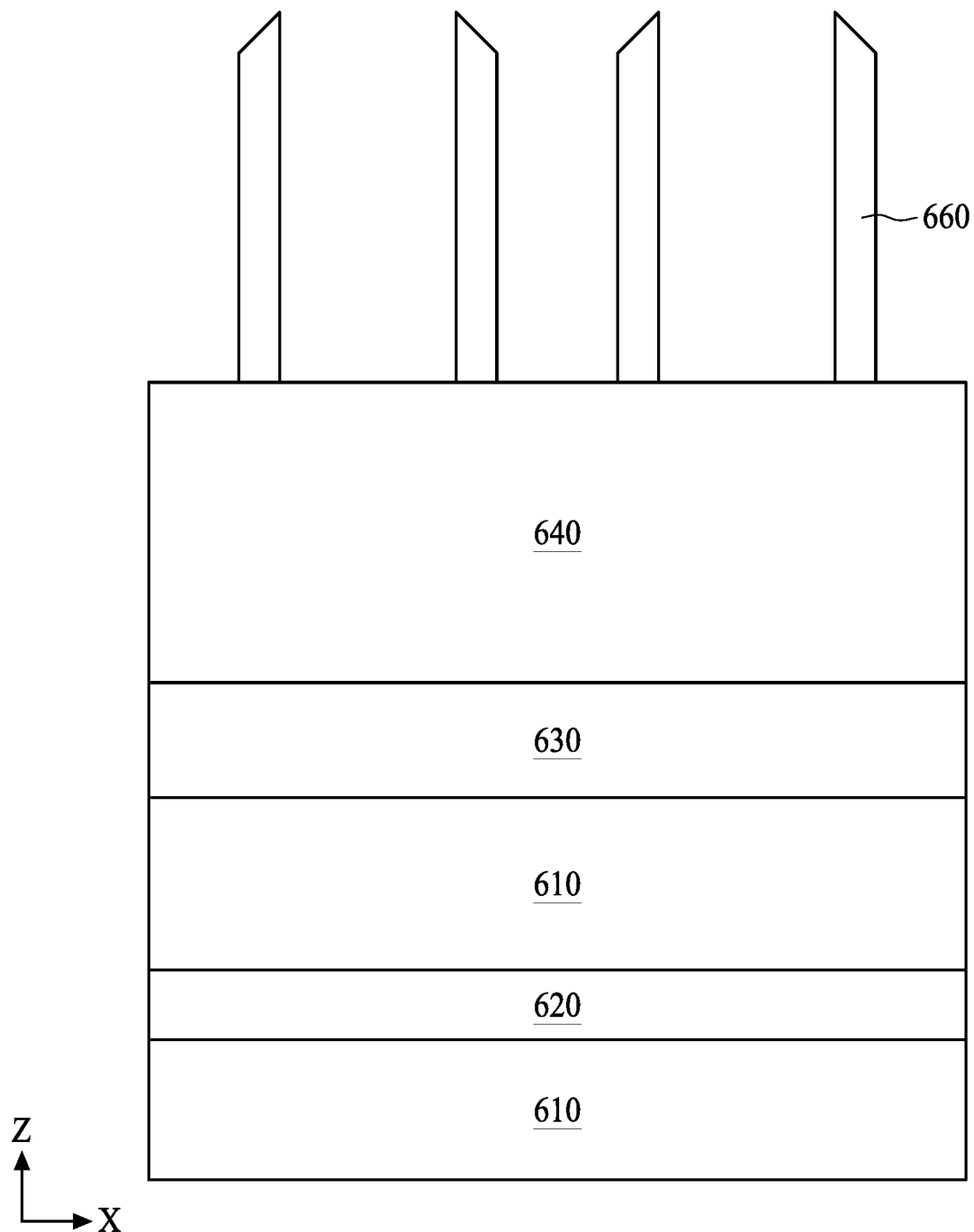
Figure 6D:
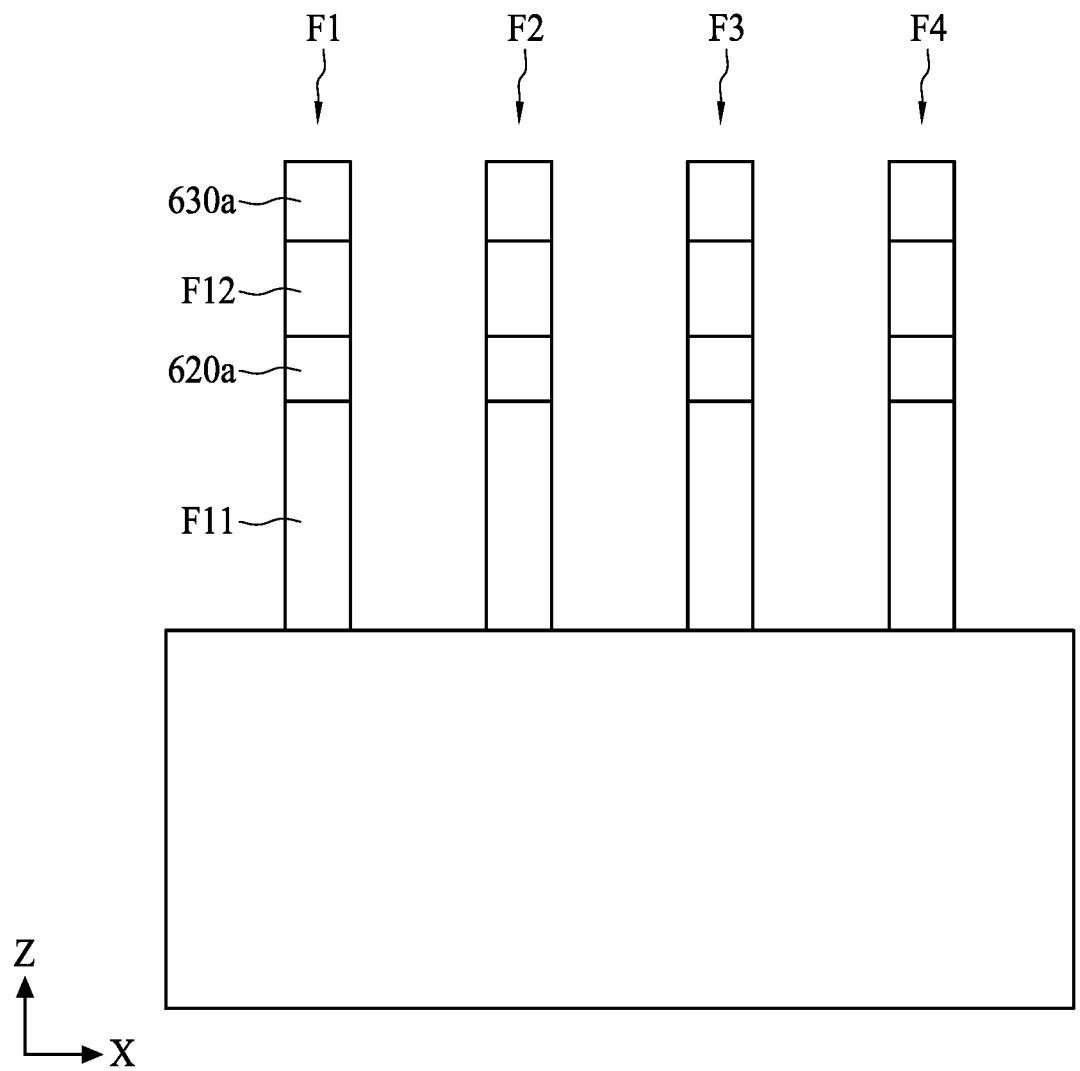

Referring to FIG. 6B, FIG. 6C, and FIG. 6D. In operation S510, semiconductor fins F1, F2, F3, and F4 are formed from the semiconductor stack 600 by performing an etching operation. In FIG. 6B, a spacer layer 660 is deposited over the oxide layer 640 and the a-Si layer 650. The spacer layer 660 may include SiN. In FIG. 6C, the a-Si layer 650 and a planar portion of the spacer layer 660 are etched by another etching operation. A lateral portion of the spacer layer 660 is remained over the oxide layer 640 and forming a mandrel. In FIG. 6D, the etching operation is performed to form the semiconductor fins F1, F2, F3, and F4.

As illustrated in FIG. 6D, after performing the etching operation, each of the semiconductor fins F1 to F4 has a fin portion F11 and a fin portion F12. The fin portion F11 is separated from the fin portion F12 by a SiGe portion 620a, and a nitride portion 630a is over the fin portion F12. The SiGe portion 620a is the remained portion of the at least one SiGe layer 620, and the nitride portion 630a is the remained portion of the nitride layer 630 after etched by the fin etching operation. Therefore, the SiGe portion 620a still has a height ranging from about 10 nm to 20 nm along the Z-direction as the SiGe layer 620.

Figure 7A:
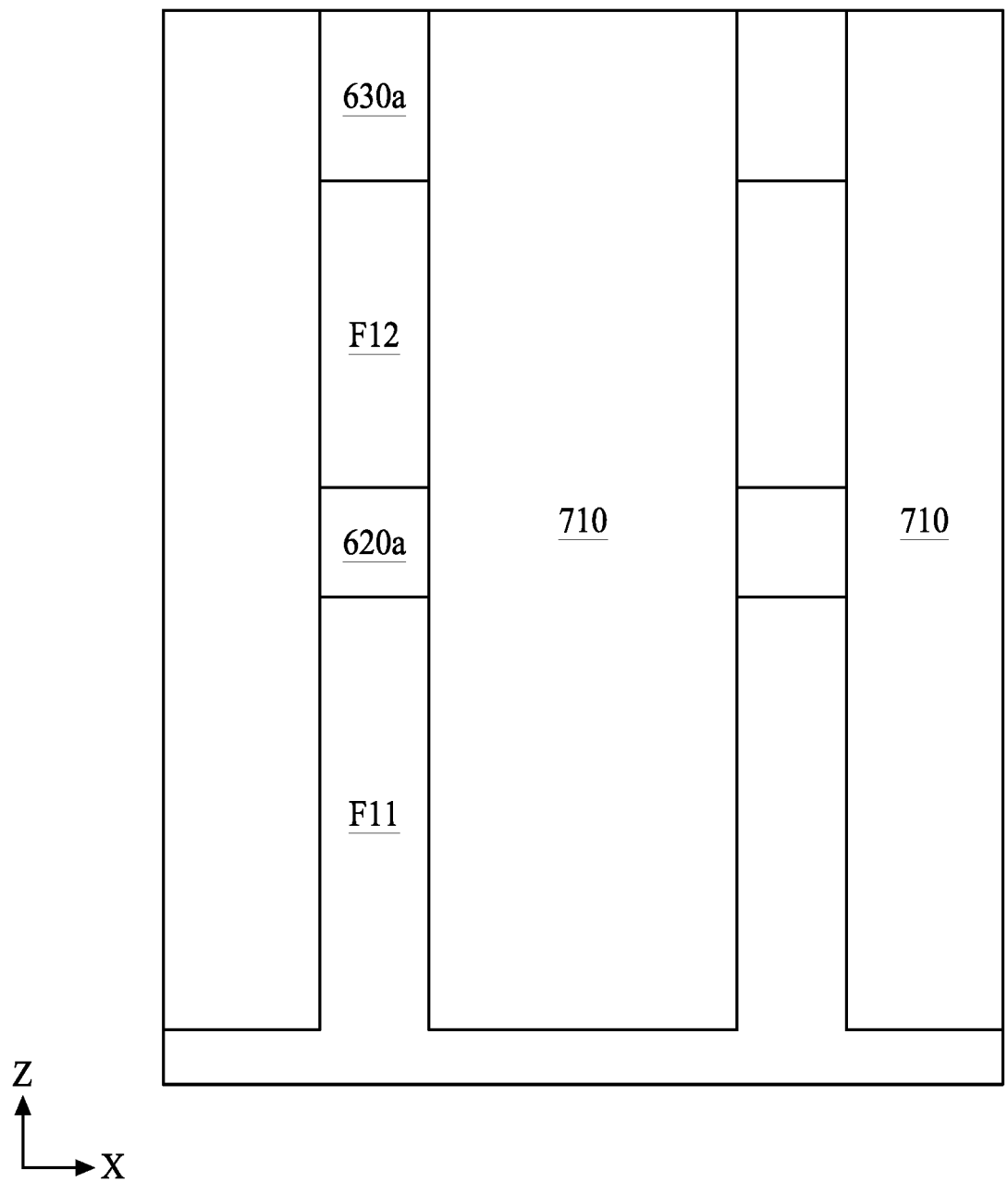
FIG. 7A, FIG. 7B, FIG. 7C and FIG. 7D are cross sectional views of a semiconductor structure at various manufacturing operations, in accordance with some embodiments of the present disclosure.
Figure 7B:
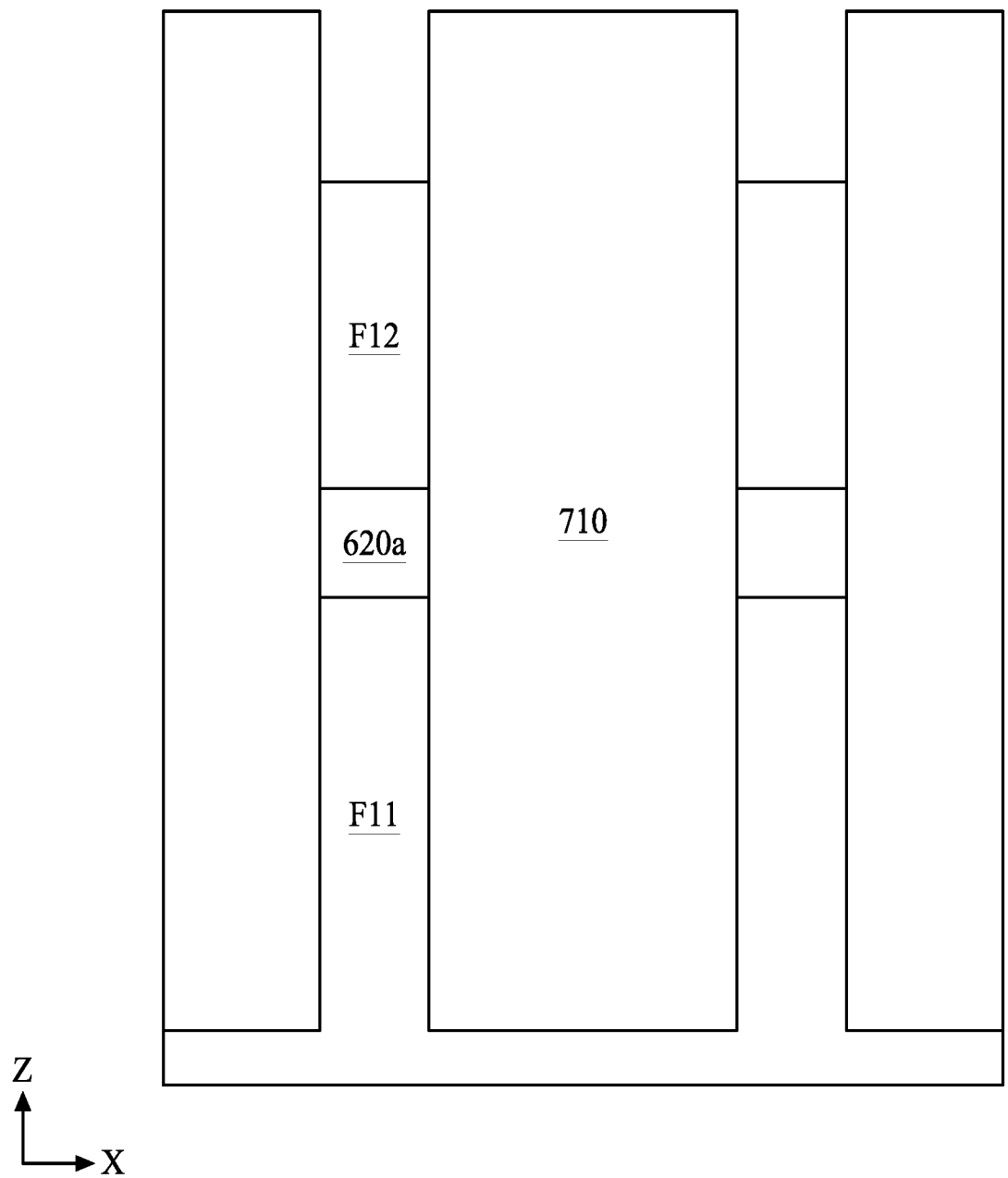
Figure 7C:
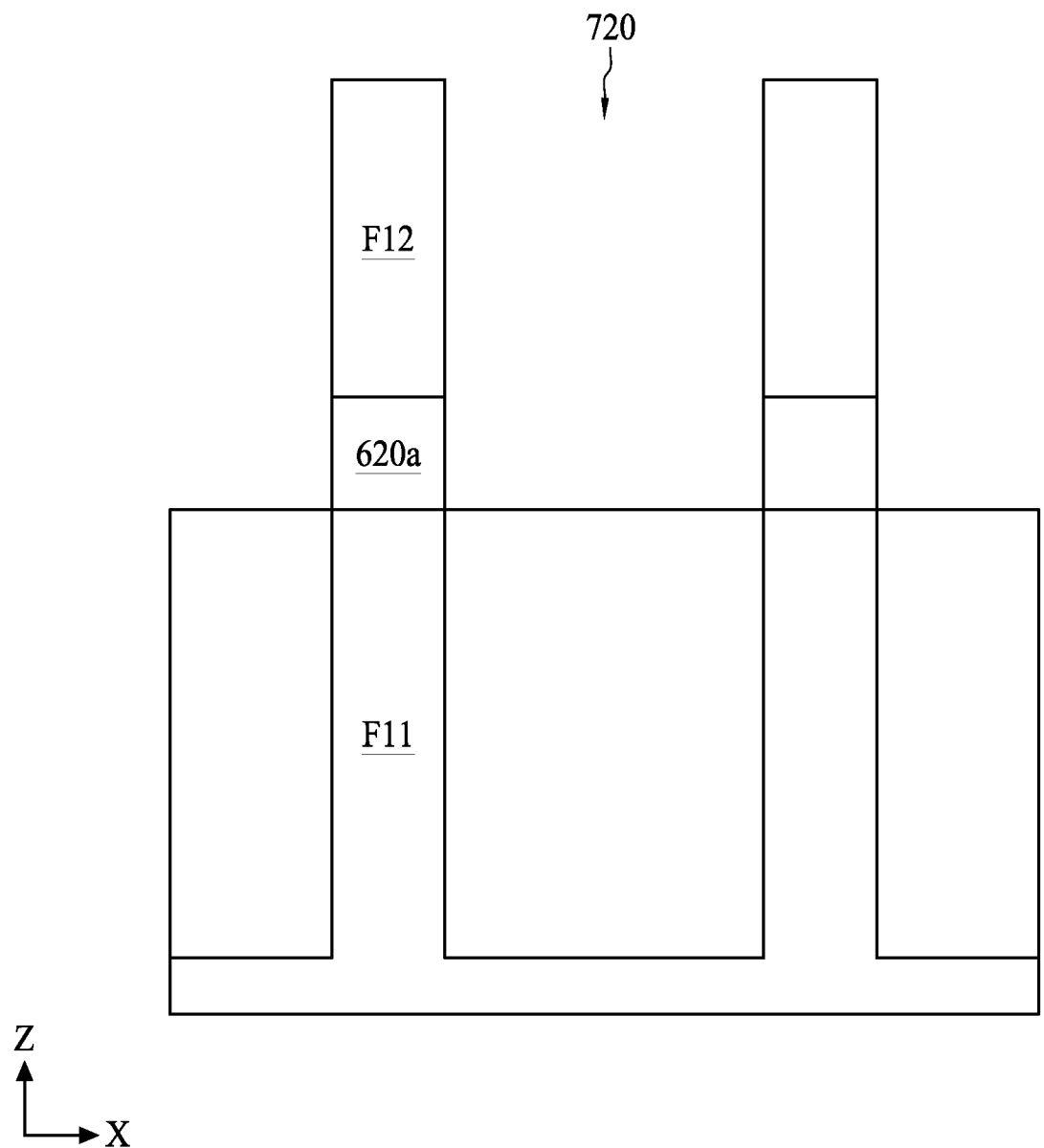

In FIG. 7A, a shallow trench isolation (STI) feature 710 between each of the fin F1 to F4 is formed. After the STI feature 710 being formed, a thinning and planarizing process to planarize top surface of the STI, for example, a chemical mechanical polishing (CMP), is performed. In FIG. 7B, the nitride portion 630a is removed by a wet etching or a dry etching operation. In FIG. 7C, the STI is etched back to expose at least the fin portion F12. In some embodiments, the etch back operation is controlled so as to make a top of the fin portion F11 substantially coplanar with the top surface of the etched STI.

Figure 7D:
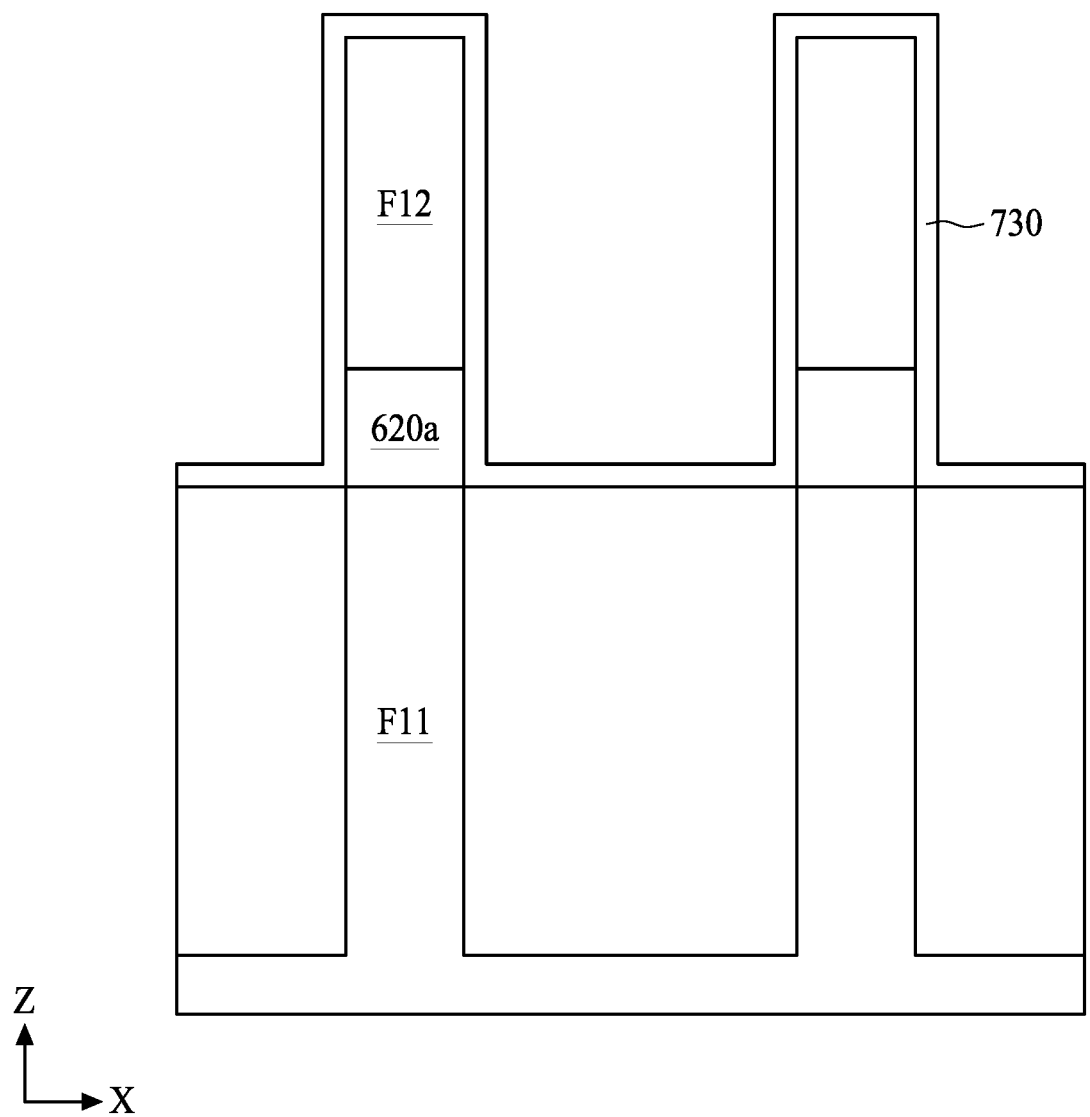

In FIG. 7D, a dielectric layer 730 is formed over the fin portion F12 and the etched STI. The dielectric layer 730 includes $SiO_2$, silicon nitride, a high-k dielectric material, and/or other suitable material. The dielectric layer 730 may be deposited by a CVD process, a subatmospheric CVD process, a flowable CVD process, an ALD process, a physical vapor deposition (PVD) process, or other suitable process. The dielectric layer 730 is configured to prevent the fin portion F12 from damaging by subsequent operations.

Figure 8A:
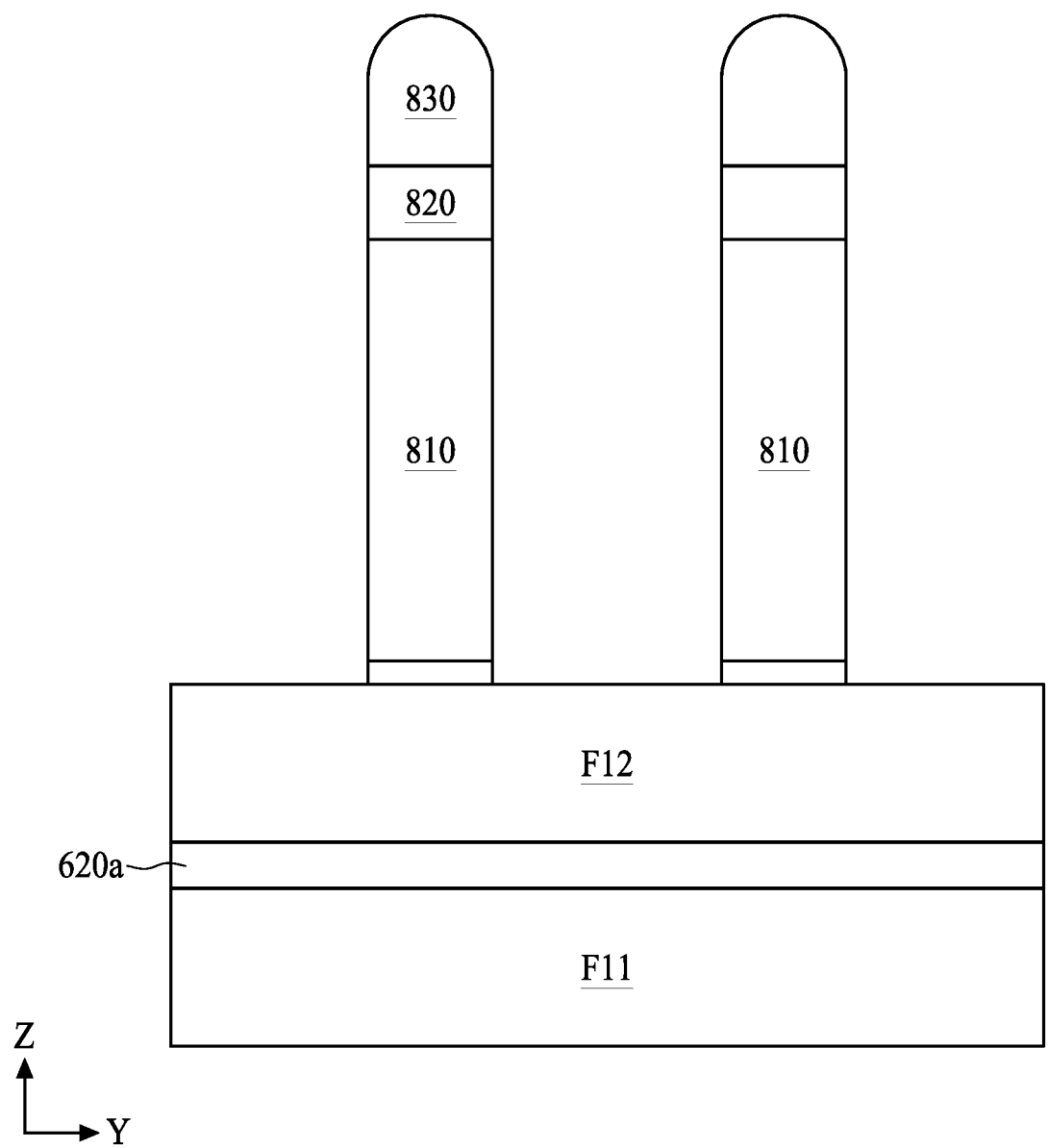
FIG. 8A, FIG. 8B, FIG. 8C, and FIG. 8D are cross sectional views of a semiconductor structure at various manufacturing operations, in accordance with some embodiments of the present disclosure.

Subsequently, in operation S515, one or more poly gate stripes 810 are formed orthogonally (extending along the Y-direction) over the semiconductor fins F1, F2, F3, and F4. In some embodiments, the poly gate stripes 810 are the sacrificial gate or dummy gate which will be removed in the subsequent replacement gate operation. In FIG. 8A, the fin portion F12 underlying the poly gate strip 810 is subsequently transformed to be a channel of the GAA FinFET. The poly gate strips 810 are used to define a source/drain region of the GAA FinFET. In some embodiments, the poly gate stripe 810 is formed by various processing steps such as layer deposition, patterning, etching, as well as other suitable processing steps. The layer deposition includes CVD, PVD, ALD, thermal oxidation, e-beam evaporation, other suitable deposition techniques, or combination thereof. The patterning includes a lithography process, and the lithography process includes photoresist coating, soft baking, mask aligning, exposure, post-exposure baking, photoresist developing, rinsing, drying, other suitable lithography techniques, and/or combination thereof. The etching process includes dry etching, wet etching, and/or other etching methods.

Figure 8B:
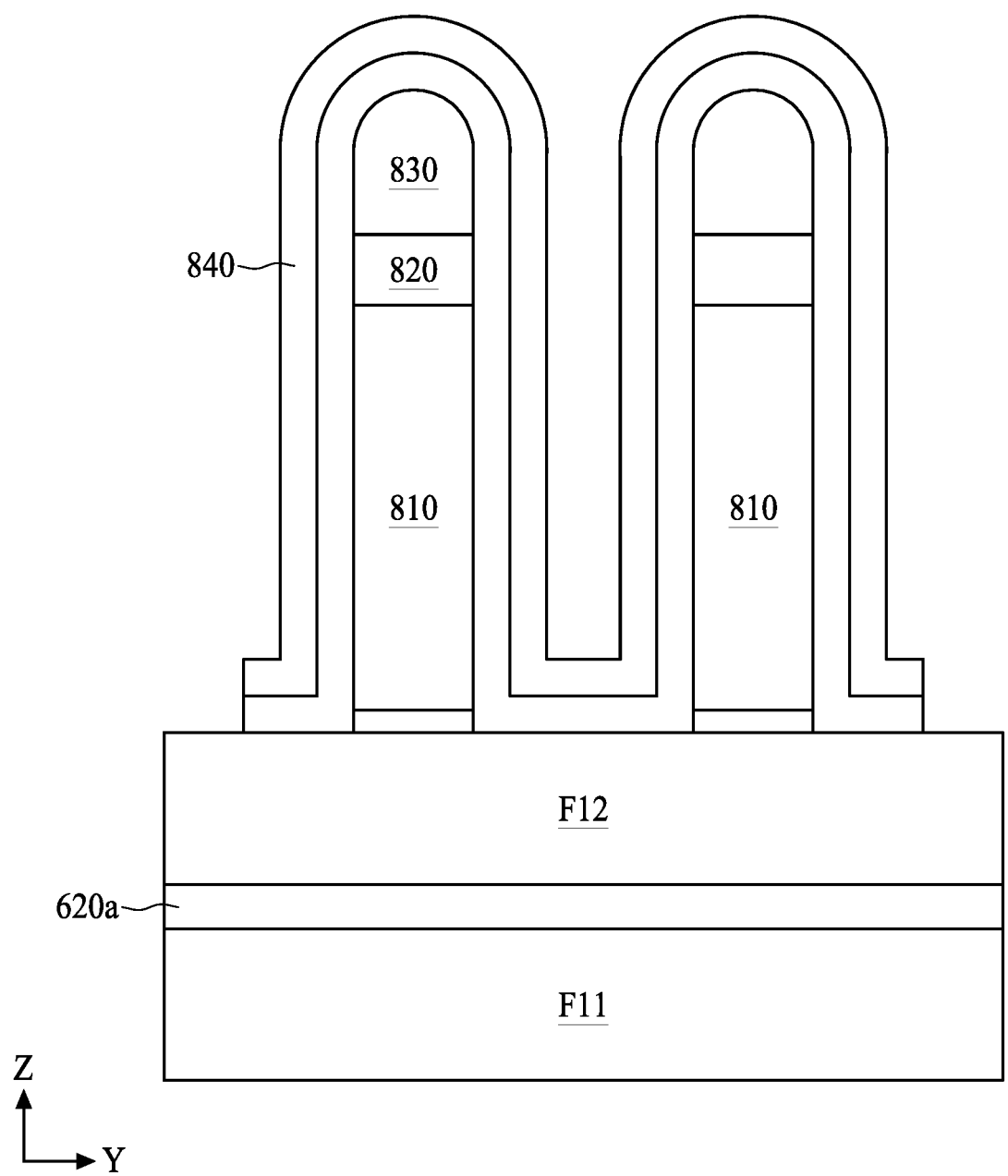

In FIG. 8A, a nitride layer 820 over the poly gate stripe 810 and an oxide layer 830 over the nitride layer 820 are stacked over the poly gate stripe 810 prior to poly gate stripe 810 patterning operation. In some embodiments, the nitride layer 820 includes $Si_3N_4$, silicon oxynitride, and/or silicon carbide. In some embodiments, the oxide layer 830 includes $SiO_2$. In FIG. 8B, a spacer layer 840 is formed conformably over the poly gate stripe 810. The spacer layer 840 is covered the poly gate stripe 810, the nitride layer 820, the oxide layer 830. In some embodiments, the spacer layer 840 is a conformal dielectric layer including silicon oxide, silicon nitride, silicon carbide, silicon oxynitride, SiCN, silicon oxycarbide, SiOCN, and/or combination thereof. The spacer layer 840 may include multiple layers, such as main spacer walls, liner layers, and the like. The spacer layer 840 is formed by CVD, subatmospheric CVD, flowable CVD, ALD, PVD, or other suitable process.

Figure 8C:
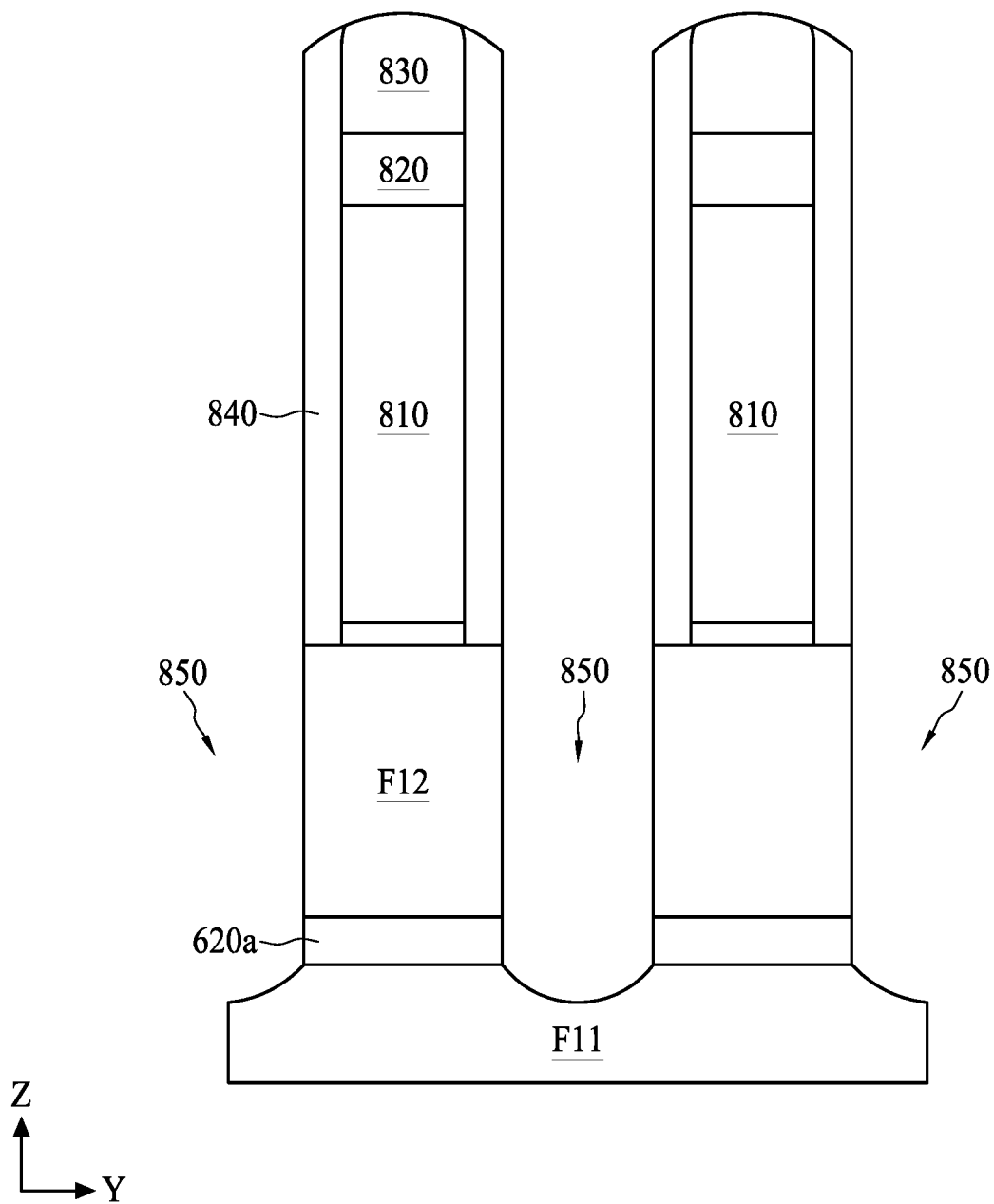

Referring to FIG. 8C and operation S520, one or more recess 850 is formed on each of the plurality of fins at a location abutting the poly gate stripe 810. In some embodiments, the recess 850 is formed to expose at least the sidewall of the SiGe portion 620a for subsequent operations.

Figure 8D:
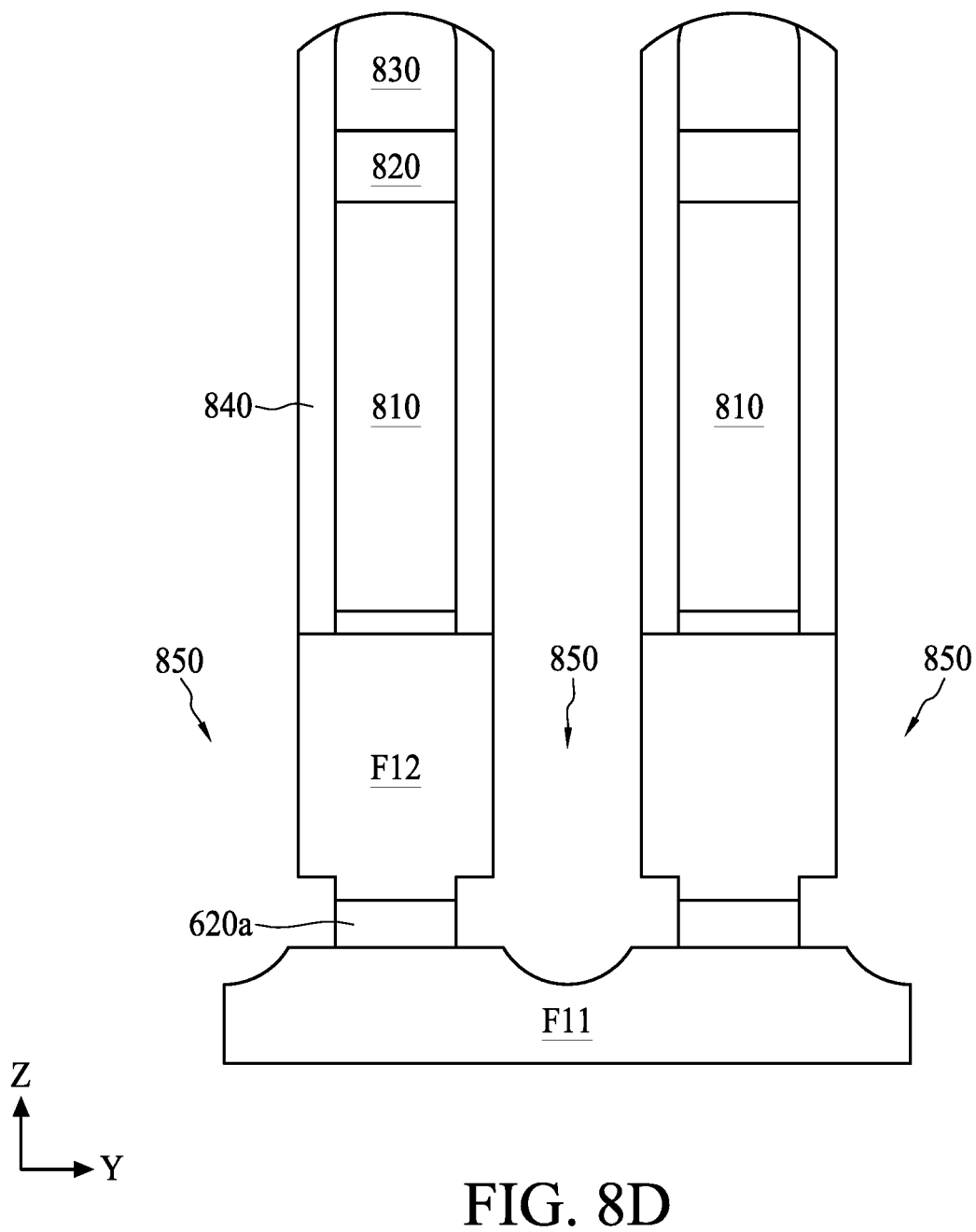

In FIG. 8D and operation S525, two opposite sidewalls of the SiGe portion 620a are recessed so as to thin the width of the SiGe portion 620a along the Y-direction. Note the partial removal or the recessing of the SiGe portion 620a is conducted through the recess 850 on each of the plurality of fins.

Figure 9A:
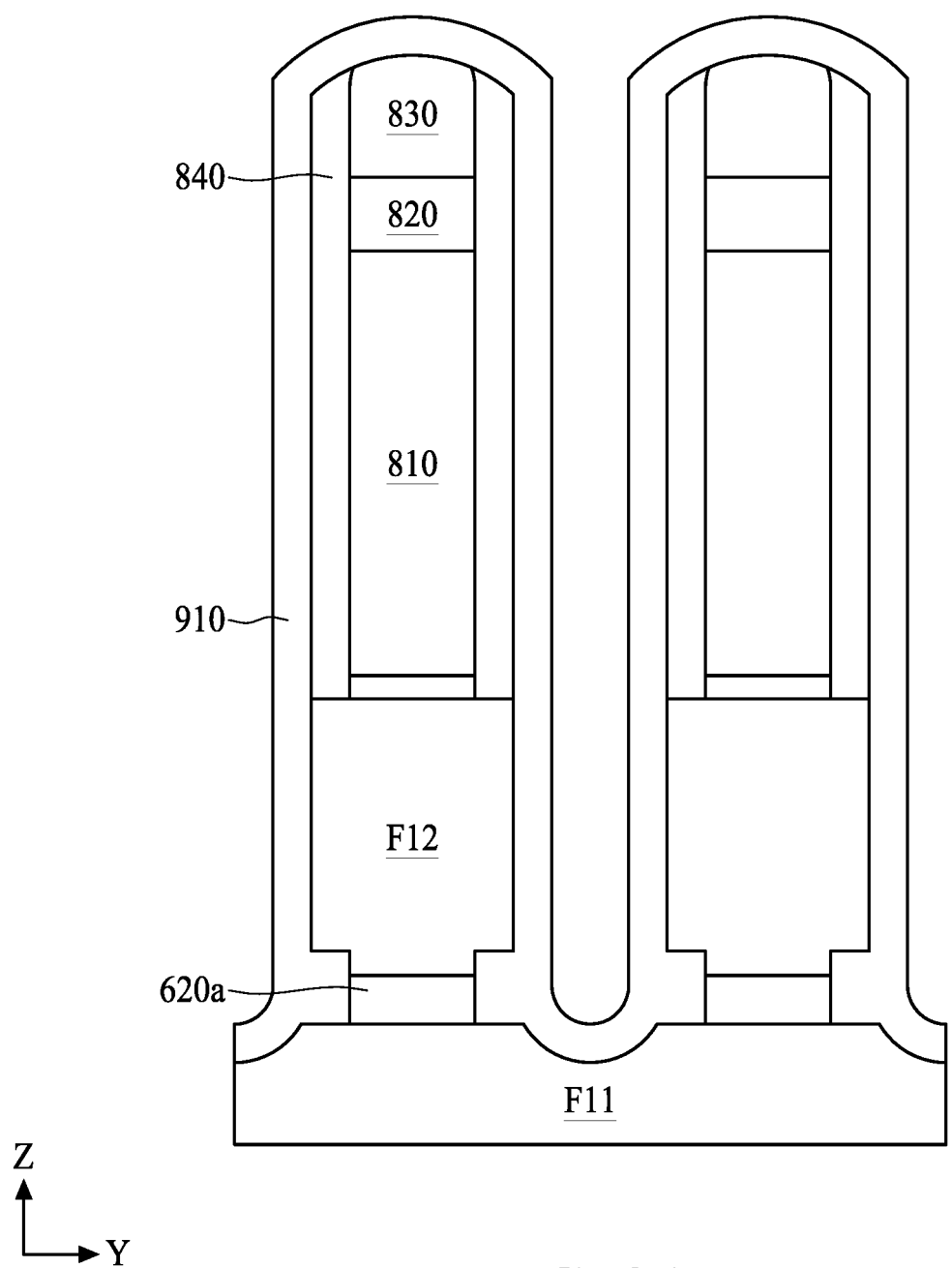
FIG. 9A, FIG. 9B, and FIG. 9C are cross sectional views of a semiconductor structure at various manufacturing operations, in accordance with some embodiments of the present disclosure.
Figure 9B:
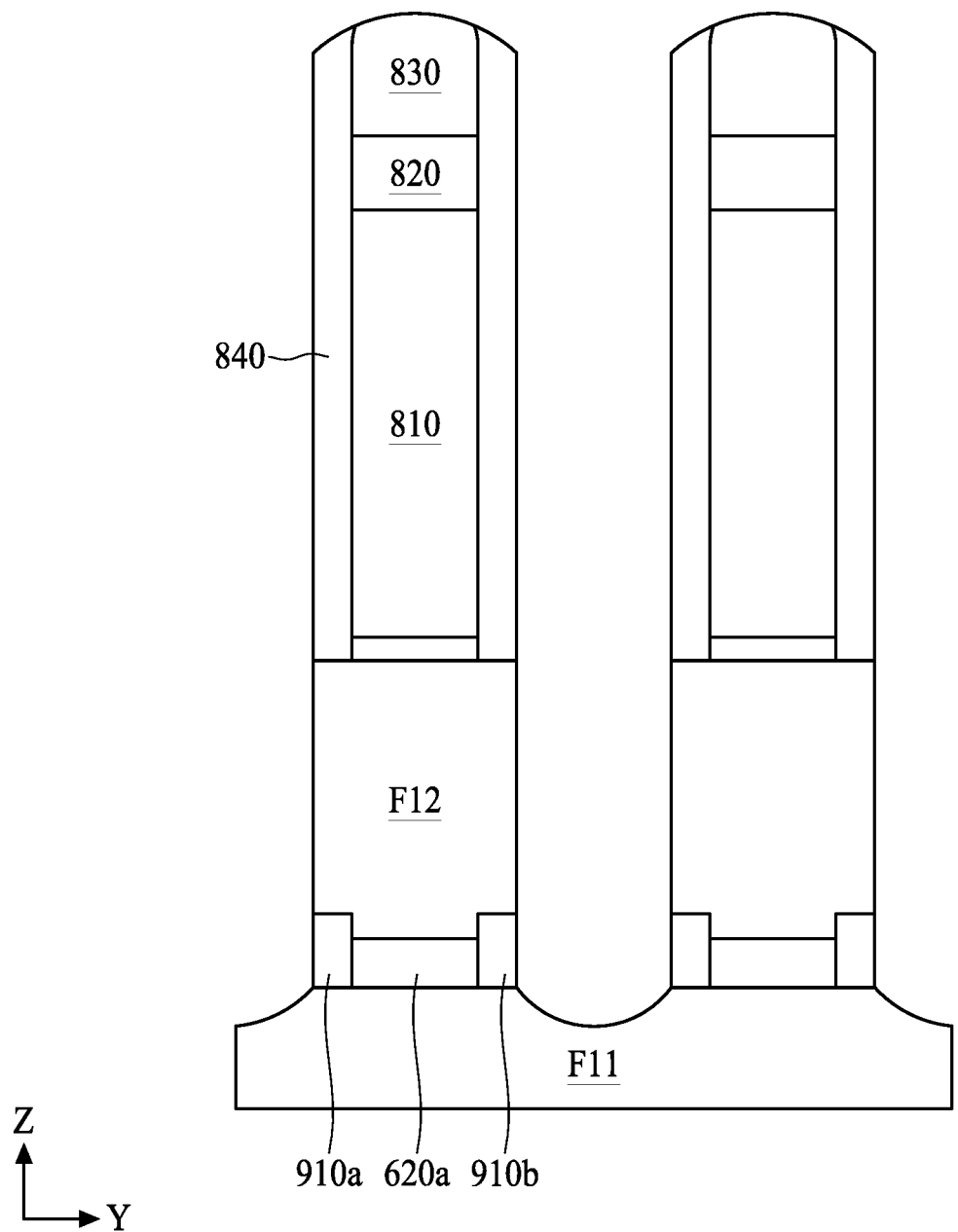
Figure 9C:
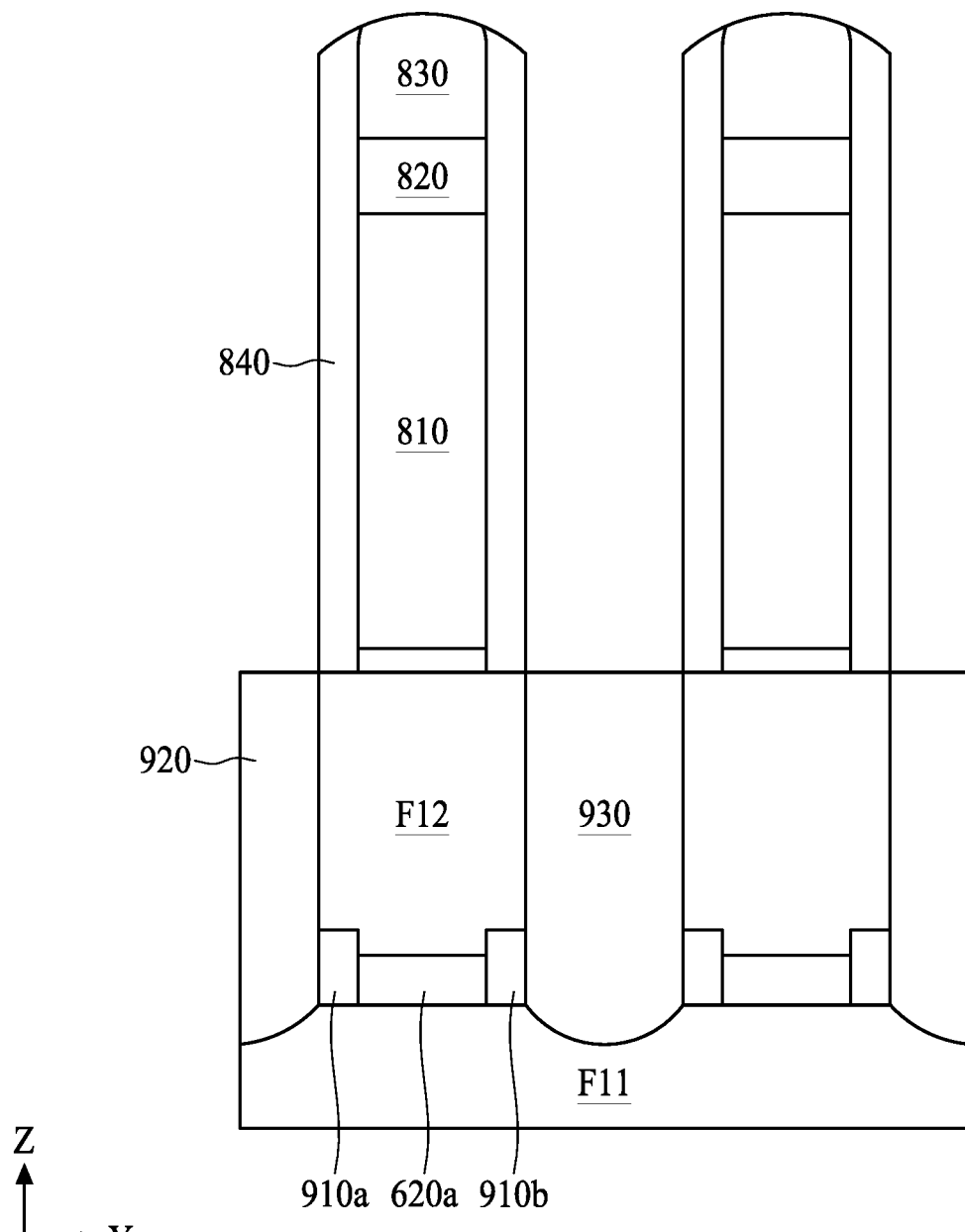

Referring to FIG. 9A and FIG. 9B. In operation S530, the spacers 910a and 910b shown in FIG. 9C are formed to surround the recessed SiGe portion 620a. In FIG. 9A, an inner spacer layer 910 is formed to cover the fin portion F12, fin portion F11, and the poly gate stripe 810. In FIG. 9B, the inner spacer layer 910 is partially etched until only the spacer 910a and the spacer 910b contacting the recessed SiGe portion 620a are remained. Recessing the SiGe portion 620a performed in operation S525 form a space defined by the sidewall of the recessed SiGe portion 620a, the fin portion F11, and the fin portion F12. The spacers 910a and 910b surround the opposite sides of the SiGe portion 620a are thus occupying the aforesaid space. In some embodiments, the spacers 910a and 910b are controlled to be substantially coplanar with the fin portion F12 along the Z-direction.

Referring to FIG. 9C and operation S535, a conductive region 920 and a conductive region 930 are formed. The conductive regions 920 and 930 are formed by for example, performing an epitaxial growth that provides an epitaxy material abutting the lateral surface of the fin portion F12 and the abutting the lateral surface of the spacers 910a and 910b. In some embodiments, the conductive regions 920 and 930 are the source/drain region of the GAA FinFET. The conductive regions 920 and 930 may include Ge, Si, GaAs, AlGaAs, SiGe, GaAsP, SiP, doped III-V materials, or other suitable material.

As illustrated in FIG. 9C, the conductive region 920 is in contact with the fin portion F11, the spacer 910a, and the fin portion F12. The conductive region 930 is in contact with the fin portion F11, the spacer 910b, and the fin portion F12. Both of the conductive regions 920 and 930 may be in contact with a portion of the fin portion F11.

Figure 10A:
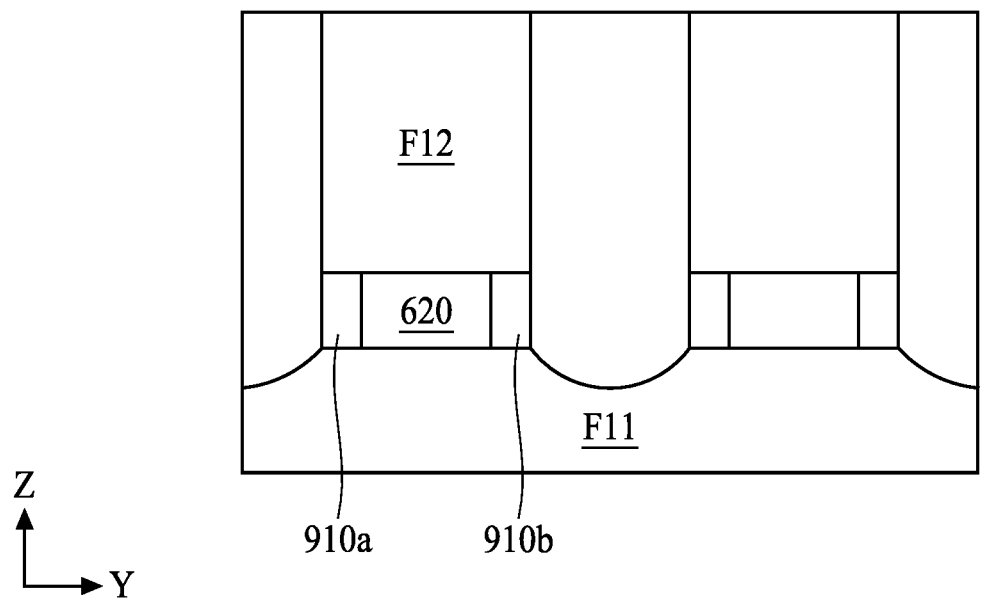
FIG. 10A, FIG. 10B, FIG. 10C, FIG. 10D, and FIG. 10E are cross sectional views of a semiconductor structure at various manufacturing operations, in accordance with some embodiments of the present disclosure.
Figure 10B:
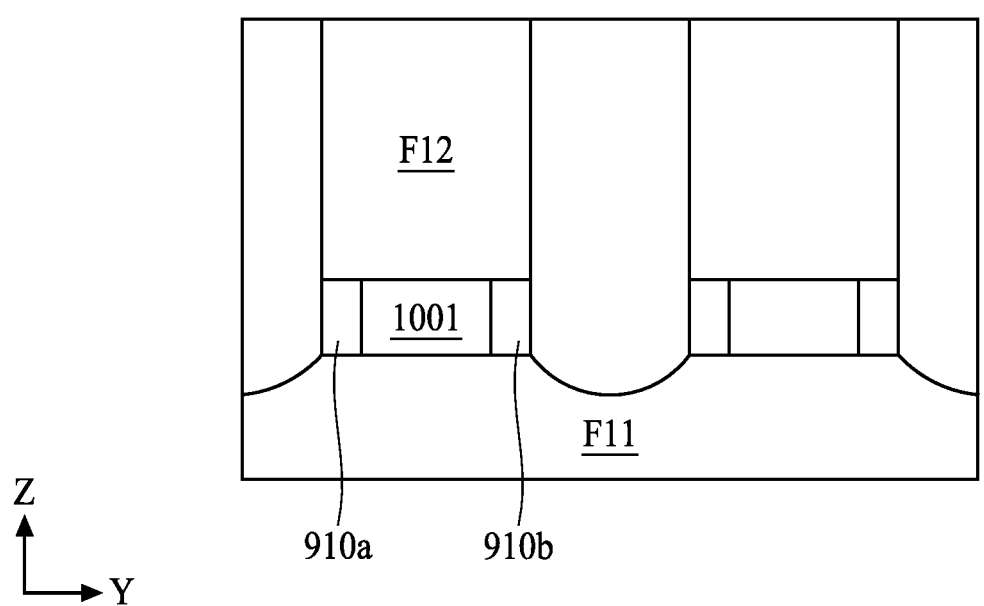
Figure 10C:
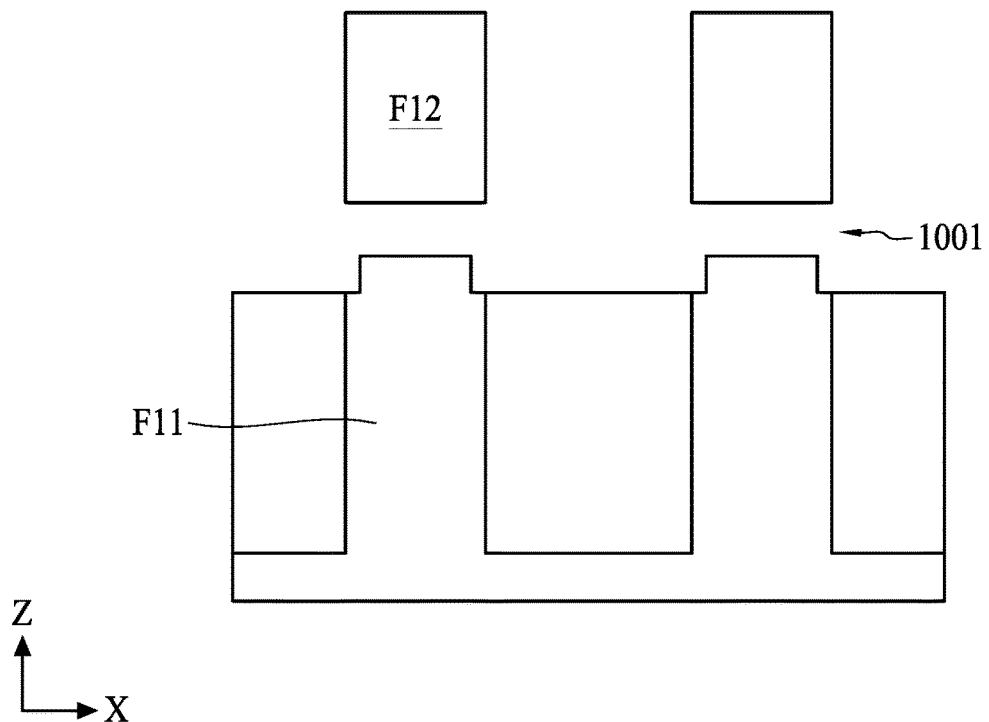

Referring to FIG. 10A, FIG. 10B, and FIG. 10C. In operation S540, the SiGe portion 620a is removed. As illustrated in FIG. 10A, before the SiGe is removed, the poly gate stripe 810, the nitride layer 820, and the oxide layer 830 may be removed. As illustrated in FIG. 10B, the SiGe portion 620a is removed by an etching operation selective to the SiGe over Si. A space defined by the spacer 910a, the spacer 910b, the fin portion F11, and the fin portion F12 is formed after the removal of the SiGe portion 620a. FIG. 10C illustrates a counterpart cross section view of FIG. 10B on an X-Z plane. The removed SiGe portion 620a forms a discontinuous region 1001 between the fin portion F11 and the fin portion F12.

Figure 10D:
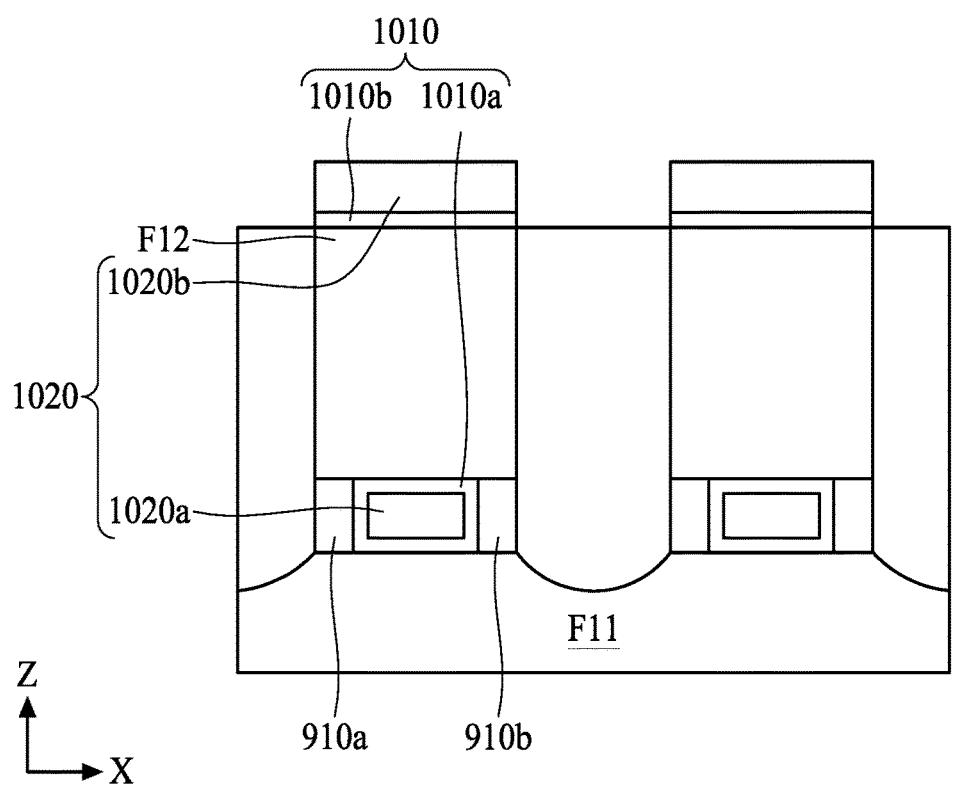
Figure 10E:
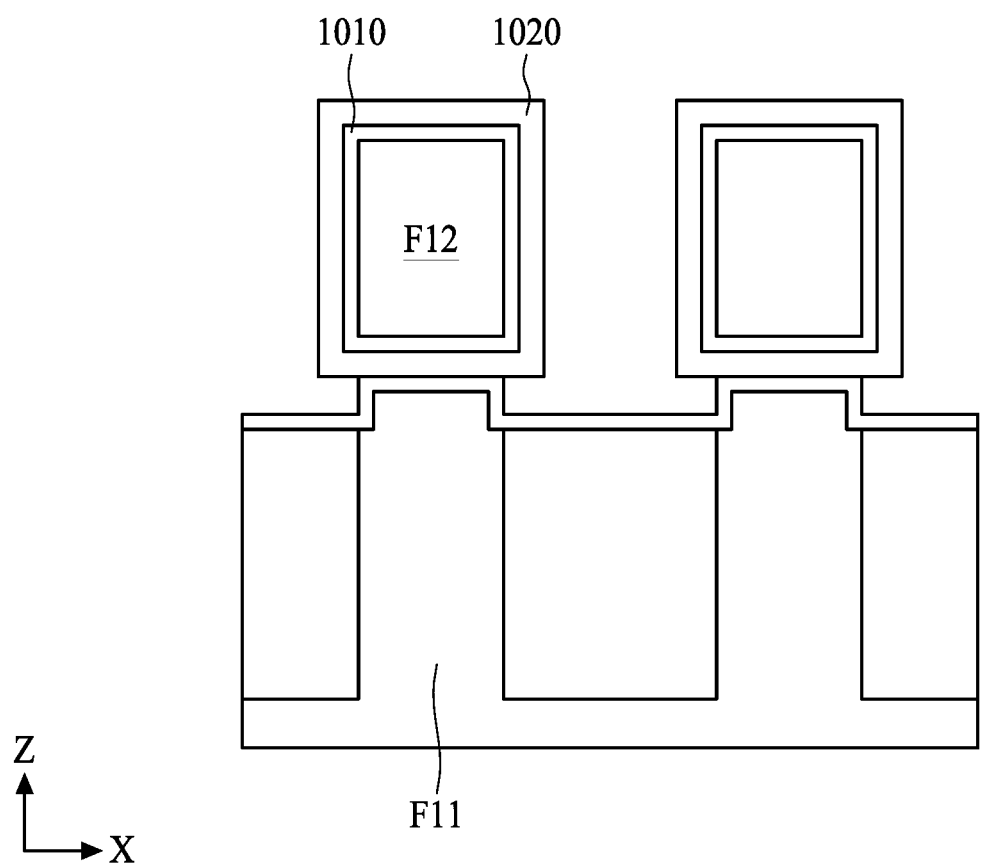

Referring to FIG. 10D and FIG. 10E. FIG. 10D shows a cross section on a Y-Z plane, and FIG. 10E shows a counterpart cross section of FIG. 10D on an X-Z plane. In operation S545, a dielectric region 1010 is formed, and in operation S550, a metal gate 1020 is formed. In some embodiments, the dielectric region 1010 includes a high-k material and is configured to be a gate dielectric of the GAA FinFET.

After the SiGe portion 620a is removed, the space defined by the fin portion F11, the fin portion F12, and the spacers 910a, 910b is empty and is filled by metal gate materials in operation S550. As illustrated in FIG. 10D, the dielectric region 1010 includes a bottom portion 1010a and an upper portion 1010b. The bottom portion 1010a is spaced between the metal gate and the fin portions F11, F12, as well as the spacers 910*a*, 910*b*. The upper portion 1010*b* of the dielectric region 1010 covers a top surface of the fin portion F12. In operation S550, a metal gate 1020 is formed. As illustrated in FIG. 10D, the metal gate 1020 includes a bottom portion 1020*a* and an upper portion 1020*b*. The bottom portion 1020*a* is formed in the space defined by the fin portion F11, the spacer 910*a*, the spacer 910*b*, and the bottom portion 1010*a* of the dielectric region 1010. The upper portion 1020*b* of the metal gate 1020 is formed over the upper portion 1010*b* of the dielectric region 1010.

As illustrated in FIG. 10E, the dielectric region 1010 is formed between the fin portion F12 and the metal gate 1020.

Some embodiments of the present disclosure provide a semiconductor structure, including a semiconductor fin, a first conductive region, a metal gate, and a first spacer. The semiconductor fin has a first portion and a second portion over the first portion. The first conductive region abuts a first lateral surface of the first portion and a first lateral surface of the second portion. The metal gate has a bottom portion and an upper portion. The bottom portion is between the first portion and the second portion of the semiconductor fin. The upper portion is over the second portion of the semiconductor fin. The first spacer is between the bottom portion of the metal gate and the first conductive region.

Some embodiments of the present disclosure provide a semiconductor structure, including a semiconductor fin, a metal gate, and an isolation feature. The semiconductor fin has a first portion and a second portion over the first portion. The metal gate has a bottom portion, an upper portion, and a lateral portion connecting the bottom portion and the upper portion, the bottom portion being between the first portion and the second portion of the semiconductor fin, and the upper portion being over the second portion of the semiconductor fin. The isolation feature abuts a lateral surface of the first portion of the semiconductor fin.

Some embodiments of the present disclosure provide a method for manufacturing a semiconductor structure. The method includes forming a semiconductor stack having at least one SiGe layer; forming a plurality of fins from the semiconductor stack by a first etching operation, each of the plurality of fins comprising a first portion and a second portion over the first portion, the first portion being separated from the second portion by a SiGe portion; forming a poly gate stripe orthogonally over the plurality of fins; forming a recess on each of the plurality of fins abutting the poly gate; recessing the SiGe portion by a second etching operation through the recess; forming a first spacer and a second spacer to surround the SiGe portion; and removing the SiGe portion.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
a semiconductor fin having a first portion and a second portion over the first portion;
a first conductive region abutting a first lateral surface of the first portion and a first lateral surface of the second portion;
a metal gate having a bottom portion and an upper portion, the bottom portion being between the first portion and the second portion of the semiconductor fin, and the upper portion being over the second portion of the semiconductor fin; and
a first spacer between the bottom portion of the metal gate and the first conductive region.

2. The semiconductor structure of claim 1, further comprising:
an insulating region having a bottom portion and an upper portion, wherein the bottom portion of the insulating region is between the first portion and the second portion of the semiconductor fin and, and the upper portion of the insulating region is between the second portion of the semiconductor fin and the upper portion of the metal gate.

3. The semiconductor structure of claim 2, wherein the first spacer is in contact with the first conductive region, the bottom portion of the insulating region, the first portion of the semiconductor fin and the second portion of the semiconductor fin.

4. The semiconductor structure of claim 2, further comprising:
a second conductive region abutting a second lateral surface of the first portion and a second lateral surface of the second portion; and
a second spacer between the bottom portion of the metal gate and the second conductive region,
wherein the second spacer is in contact with the second conductive region, the bottom portion of the insulating region, the first portion of the semiconductor fin, and the second portion of the semiconductor fin.

5. The semiconductor structure of claim 1, wherein a distance between the first portion and the second portion of the semiconductor fin has a range of about 10 nanometers (nm) to about 20 nm.

6. The semiconductor structure of claim 1, wherein the second portion of the semiconductor fin has a first sub-portion and a second sub-portion over the first sub-portion, and the metal gate further has a first intermediate portion, wherein the first sub-portion and the second sub-portion of the first portion of the semiconductor fin are separated by the first intermediate portion of the metal gate.

7. The semiconductor structure of claim 6, further comprising
a third spacer between the first sub-portion and the second sub-portion of the second portion of the semiconductor fin; and
a fourth spacer between the first sub-portion and the second sub-portion of the second portion of the semiconductor fin,
wherein the third spacer and the fourth spacer are separated by the first intermediate portion of the metal gate.

8. The semiconductor structure of claim 6, wherein the second portion of the semiconductor fin further has a third sub-portion over the second sub-portion, and the metal gate further has a second intermediate portion, wherein the second sub-portion and the third sub-portion of the first portion of the semiconductor fin are separated by the second intermediate portion of the metal gate, wherein the semiconductor structure further comprises:
a fifth spacer between the second sub-portion and the third sub-portion of the second portion of the semiconductor fin; and
a sixth spacer between the second sub-portion and the third sub-portion of the second portion of the semiconductor fin,
wherein the fifth spacer and the sixth spacer are separated by the second intermediate portion of the metal gate.

9. A semiconductor structure, comprising:
a semiconductor fin having a first portion and a second portion over the first portion;
a metal gate having a bottom portion, an upper portion, and a lateral portion connecting the bottom portion and the upper portion, the bottom portion being between the first portion and the second portion of the semiconductor fin, and the upper portion being over the second portion of the semiconductor fin; and
an isolation feature abutting a lateral surface of the first portion of the semiconductor fin.

10. The semiconductor structure of claim 9, further comprising:
an insulating region surrounding the second portion of the semiconductor fin, wherein the insulating region separates the second portion of the semiconductor fin from the metal gate.

11. The semiconductor structure of claim 9, wherein a first width of the first portion of the semiconductor fin is not less than a second width of the second portion of the semiconductor fin, and a height of the second portion of the semiconductor is greater than the second width.

12. The semiconductor structure of claim 9, wherein the second portion of the semiconductor fin has a first sub-portion and a second sub-portion over the first sub-portion,
wherein the metal gate further has a first intermediate portion between the first sub-portion and the second sub-portion of the second portion of the semiconductor fin.

13. The semiconductor structure of claim 12, wherein the second portion of the semiconductor fin further has a third sub-portion over the second sub-portion,
wherein the metal gate further has a second intermediate portion between the second sub-portion and the third sub-portion of the second portion of the semiconductor fin.

14. The semiconductor structure of claim 12, wherein the first sub-portion and the second sub-portion of the second portion of the semiconductor fin are separated from the metal gate by the insulating region.

15. The semiconductor structure of claim 9, wherein the second portion of the semiconductor fin is a trapezoid.

16. The semiconductor structure of claim 9, wherein the second portion of the semiconductor fin is a triangle.

17. A semiconductor structure, comprising:
a semiconductor fin having a first portion and a second portion over the first portion;
a metal gate surrounding the second portion of the semiconductor fin;
a first spacer between the first portion and the second portion of the semiconductor fin; and
a second spacer between the first portion and the second portion of the semiconductor fin,
wherein the first spacer separated from the second spacer by the metal gate.

18. The semiconductor structure of claim 17, further comprising:
a first conductive region abutting a first lateral surface of the first portion, a first lateral surface of the second portion, and the first spacer; and
a second conductive region abutting a second lateral surface of the first portion, a second lateral surface of the second portion, and the second spacer,
wherein the first lateral surface of the first portion is opposite to the second lateral surface of the first portion, and the first lateral surface of the second portion is opposite to the second lateral surface of the second portion.

19. The semiconductor structure of claim 17, further comprising:
an insulating region surrounding the second portion of the semiconductor fin, wherein the insulating region separates the second portion of the semiconductor fin from the metal gate.

20. The semiconductor of claim 17, further comprising:
an isolation feature abutting first portion of the semiconductor fin, wherein the isolation feature is coplanar with the first portion of the semiconductor fin.

* * * * *